US006311316B1

(12) United States Patent
Huggins et al.

(10) Patent No.: US 6,311,316 B1
(45) Date of Patent: Oct. 30, 2001

(54) DESIGNING INTEGRATED CIRCUIT GATE ARRAYS USING PROGRAMMABLE LOGIC DEVICE BITSTREAMS

(75) Inventors: Alan H. Huggins, Gilroy; David E. Schmulian, San Jose; John MacPherson, Fremont; William L. Devanney, Menlo Park, all of CA (US)

(73) Assignee: Clear Logic, Inc., San Jose, CA (US)

( * ) Notice: Subject to any disclaimer, the term of this patent is extended or adjusted under 35 U.S.C. 154(b) by 0 days.

(21) Appl. No.: 09/211,515

(22) Filed: Dec. 14, 1998

(51) Int. Cl.[7] .............................. G06F 17/50; G06F 7/38; H01L 25/00
(52) U.S. Cl. .................................. 716/12; 716/3; 716/16; 326/37; 326/41; 326/39; 326/47
(58) Field of Search .................................. 716/17, 3, 12, 716/16; 717/1; 326/38, 37, 39, 47, 41

(56) References Cited

U.S. PATENT DOCUMENTS

| | | | |
|---|---|---|---|
| 5,426,379 | 6/1995 | Trimberger | 326/39 |
| 5,712,577 | 1/1998 | Cho | 326/38 |
| 5,717,928 * | 2/1998 | Campmas et al. | 717/1 |
| 5,740,069 | 4/1998 | Agrawal et al. | 716/16 |
| 5,744,979 | 4/1998 | Goetting | 326/39 |
| 5,745,734 | 4/1998 | Craft et al. | 716/16 |
| 5,752,006 | 5/1998 | Baxter | 703/14 |
| 5,760,611 | 6/1998 | Gould | 326/113 |
| 5,778,439 | 7/1998 | Trimberger et al. | 711/153 |
| 5,784,313 | 7/1998 | Trimberger et al. | 365/182 |
| 5,808,351 | 9/1998 | Nathan et al. | 257/528 |
| 5,811,986 | 9/1998 | Agrawal et al. | 326/39 |
| 5,815,405 * | 9/1998 | Baxter | 716/3 |
| 6,060,902 * | 5/2000 | Albu et al. | 326/38 |
| 6,120,551 * | 9/2000 | Law et al. | 716/17 |

* cited by examiner

Primary Examiner—Matthew Smith
Assistant Examiner—Jibreel Speight
(74) Attorney, Agent, or Firm—Myers Bigel Sibley & Sajovec

(57) ABSTRACT

Methods of designing integrated circuit gate arrays include the step of generating a netlist for a gate array integrated circuit having at least first logic and signal resources therein, directly from bitstream data which characterizes a programmable logic device having a first operational functionality and the first logic and signal resources as well. The generating step is also followed by the step of using the netlist to configure the first logic and signal resources within the gate array integrated circuit to provide the first functionality. A preferred integrated circuit design system is also provided and includes a programmable logic device having pre-programmed logic and signal resources therein and a gate array device having base logic and signal resources therein which are equivalent to the unprogrammed logic and signal resources of the programmable logic device. A computer-based apparatus is also provided for decoding a bitstream that characterizes the programmable logic device having a first operational functionality when programmed, into a netlist that designates electrical connections in the gate array device when wired to have the first operational functionality, and to provide a method for generating scan-based test vectors to verify the first functionality. Accordingly, when switching from a functional programmable logic device (PLD) implementation to a gate array implementation, it is unnecessary to start the design process over from scratch by performing logic synthesis, place and route and other front end design operations associated with conventional gate array design techniques.

20 Claims, 27 Drawing Sheets

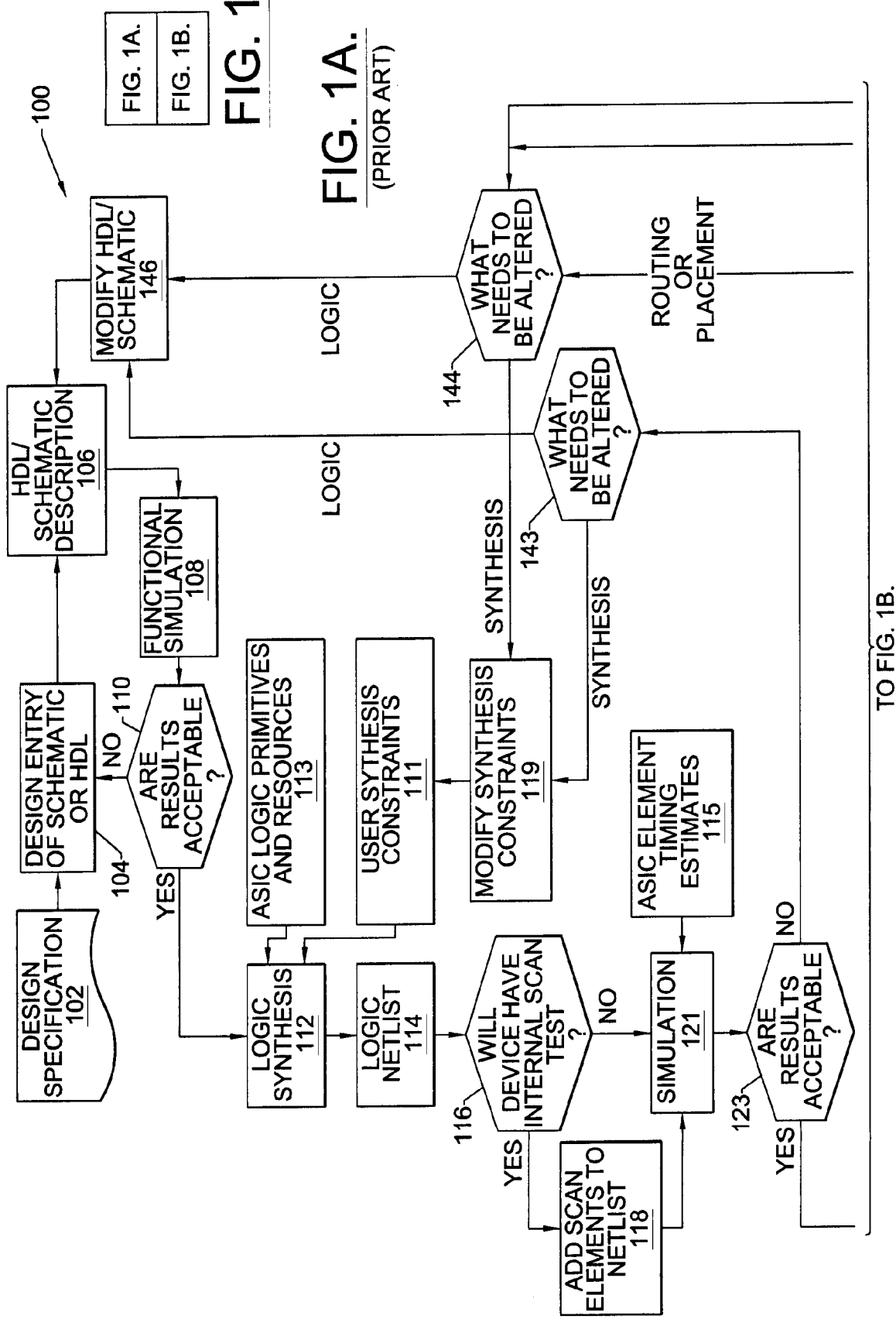

FIG. 6
Bitstream file layout  600

| Rec # | Bit position 1 | 11 | 21 | ... | 211 | 221 | 231 |
|---|---|---|---|---|---|---|---|
| 1 | Header record | | | . . . | | | 610 |
| 2 | Top I/O bits | | | . . . | | | 620 |
| 3 | | | | . . . | | | |
| 4 | | | | . . . | | | |
| 5 | Left I/O bits | Logic bits | | . . . | | | Right I/O Bits |
| 6-12 | | | | . . . | | | |
| ... | | | | | | | |
| 117-124 | | LB 3,1 LE Config bits | LB 3,2 LE Config bits  650 | . . . | LB 3,21 LE Config bits | LB 3,22 LE Config bits | |
| ... | | | | | | | |
| 194-204 | | | | . . . | | | |
| 205-207 | Bottom I/O records | | | . . . | | | 630 |
| 208 | Trailer record | | | . . . | | | 640 |

FIG. 7
LB LE Config bit layout

700

701

| Rec # | LE # | Bit Position 1 | 2 | 3 | ... | 8 | 9 | 10 |
|---|---|---|---|---|---|---|---|---|
| 1 | 1 | 0=JPRENOT=T<br>0=JPR=F<br>1=JPRENOT=F<br>1=JPRE=T | unused | 0=KUNREG=T<br>0=KREG=F<br>1=KUNREG=F<br>1=KREG=T | . . . | unused | 0=QUPDWN=T<br>0=QNORM=F<br>1=QUPDWN=F<br>1=QNORM=T | 0=SUPDWN=T<br>0=SNORM=F<br>1=SUPDWN=F<br>1=SNORM=T |
| 2 | 2 | 0=JPRENOT=T<br>0=JPR=F<br>1=JPRENOT=F<br>1=JPRE=T | unused | 0=KUNREG=T<br>0=KREG=F<br>1=KUNREG=F<br>1=KREG=T | . . . | unused | 0=QUPDWN=T<br>0=QNORM=F<br>1=QUPDWN=F<br>1=QNORM=T | 0=SUPDWN=T<br>0=SNORM=F<br>1=SUPDWN=F<br>1=SNORM=T |
| 3 | 3 | 0=JPRENOT=T<br>0=JPR=F<br>1=JPRENOT=F<br>1=JPRE=T | unused | 0=KUNREG=T<br>0=KREG=F<br>1=KUNREG=F<br>1=KREG=T | . . . | unused | 0=QUPDWN=T<br>0=QNORM=F<br>1=QUPDWN=F<br>1=QNORM=T | 0=SUPDWN=T<br>0=SNORM=F<br>1=SUPDWN=F<br>1=SNORM=T |
| 4 | 4 | 0=JPRENOT=T<br>0=JPR=F<br>1=JPRENOT=F<br>1=JPRE=T | unused | 0=KUNREG=T<br>0=KREG=F<br>1=KUNREG=F<br>1=KREG=T | . . . | unused | 0=QUPDWN=T<br>0=QNORM=F<br>1=QUPDWN=F<br>1=QNORM=T | 0=SUPDWN=T<br>0=SNORM=F<br>1=SUPDWN=F<br>1=SNORM=T |
| 5 | 5 | 0=JPRENOT=T<br>0=JPR=F<br>1=JPRENOT=F<br>1=JPRE=T | unused | 0=KUNREG=T<br>0=KREG=F<br>1=KUNREG=F<br>1=KREG=T | . . . | unused | 0=QUPDWN=T<br>0=QNORM=F<br>1=QUPDWN=F<br>1=QNORM=T | 0=SUPDWN=T<br>0=SNORM=F<br>1=SUPDWN=F<br>1=SNORM=T |
| 6 | 6 | 0=JPRENOT=T<br>0=JPR=F<br>1=JPRENOT=F<br>1=JPRE=T | unused | 0=KUNREG=T<br>0=KREG=F<br>1=KUNREG=F<br>1=KREG=T | . . . | unused | 0=QUPDWN=T<br>0=QNORM=F<br>1=QUPDWN=F<br>1=QNORM=T | 0=SUPDWN=T<br>0=SNORM=F<br>1=SUPDWN=F<br>1=SNORM=T |
| 7 | 7 | 0=JPRENOT=T<br>0=JPR=F<br>1=JPRENOT=F<br>1=JPRE=T | unused | 0=KUNREG=T<br>0=KREG=F<br>1=KUNREG=F<br>1=KREG=T | . . . | unused | 0=QUPDWN=T<br>0=QNORM=F<br>1=QUPDWN=F<br>1=QNORM=T | 0=SUPDWN=T<br>0=SNORM=F<br>1=SUPDWN=F<br>1=SNORM=T |
| 8 | 8 | 0=JPRENOT=T<br>0=JPR=F<br>1=JPRENOT=F<br>1=JPRE=T | unused | 0=KUNREG=T<br>0=KREG=F<br>1=KUNREG=F<br>1=KREG=T | . . . | unused | 0=QUPDWN=T<br>0=QNORM=F<br>1=QUPDWN=F<br>1=QNORM=T | 0=SUPDWN=T<br>0=SNORM=F<br>1=SUPDWN=F<br>1=SNORM=T |

FIG. 8
LB BASE COORDINATES

Row Base coordinates

| Row # | Y-coord | |
|---|---|---|
| 1 | 2050 | |
| 2 | 1050 | 800 |
| 3 | 50 | |
| 4 | -950 | |
| 5 | -1950 | |

Column Base coordinates

| Col # | X-coord | |
|---|---|---|
| 1 | -2100 | |
| 2 | -1910 | |
| 3 | -1720 | |
| 4 | -1530 | |
| 5 | -1340 | 850 |
| 6 | -1150 | |
| 7 | -960 | |
| 8 | -770 | |
| 9 | -580 | |
| 10 | -390 | |
| 11 | -200 | |
| 12 | -10 | |
| 13 | 180 | |
| 14 | 370 | |
| 15 | 560 | |
| 16 | 750 | |
| 17 | 940 | |
| 18 | 1130 | |
| 19 | 1320 | |
| 20 | 1510 | |
| 21 | 1700 | |
| 22 | 1890 | |

FIG. 9

LB hookup connection coordinates
Offset from LB base coordinates
for Logic Status = True

860

| LE # | | JPRENOT | JPRE | KUNREG | KREG | ... | QUPDWN | QNORM | SUPDWN | SNORM |
|---|---|---|---|---|---|---|---|---|---|---|
| 1 | X | 180 | 180 | 180 | 70 | . | 70 | 62 | 180 | 62 |
|   | Y | 905 | 885 | 875 | 910 | . | 880 | 905 | 865 | 885 |
| 2 | X | 180 | 180 | 180 | 70 | . | 70 | 62 | 180 | 62 |
|   | Y | 805 | 785 | 775 | 810 | . | 780 | 805 | 765 | 785 |
| 3 | X | 180 | 180 | 180 | 70 | . | 70 | 62 | 180 | 62 |
|   | Y | 705 | 685 | 675 | 710 | . | 680 | 705 | 665 | 685 |
| 4 | X | 180 | 180 | 180 | 70 | . | 70 | 72 | 180 | 62 |
|   | Y | 605 | 585 | 575 | 610 | . | 580 | 605 | 565 | 585 |
| 5 | X | 180 | 180 | 180 | 70 | . | 70 | 62 | 180 | 62 |
|   | Y | 505 | 485 | 475 | 510 | . | 480 | 505 | 485 | 485 |
| 6 | X | 180 | 180 | 180 | 70 | . | 70 | 62 | 180 | 62 |
|   | Y | 405 | 385 | 375 | 410 | . | 380 | 405 | 365 | 385 |
| 7 | X | 180 | 180 | 180 | 70 | . | 70 | 62 | 180 | 62 |
|   | Y | 305 | 285 | 275 | 310 | . | 280 | 305 | 265 | 285 |
| 8 | X | 180 | 180 | 180 | 70 | . | 70 | 82 | 180 | 62 |
|   | Y | 205 | 185 | 175 | 210 | . | 180 | 205 | 165 | 185 |

FIG. 10A

---
X-Sun-Data-Type: text
X-Sun-Data-Description: text
X-Sun-Data-Name: text
X-Sun-Charset: us-ascii
X-Sun-Content-Lines: 485

```
module le_1_1_1(SCANCLK, SCANCLKB, SDI, CAPTURE, SHIFT, UPDATE, TEST,
NORMAL, CASCADEIN,
        DATA1, DATA2, DATA3, DATA4, CARRYIN, C2IN, LABCTR1, LABCTR2,
         LABCTR3, LABCTR4, POR, SDOUT, LEOUT, CASCADEOUT,
              CARRYOUT, C2OUT);

input SCANCLK;
input SCANDLKB;
input SDI;
input CAPTURE;
input SHIFT;
input UPDATE;
input TEST;
input NORMAL;
input CASCADEIN;
input DATA1;
input DATA2;
input DATA3;
input DATA4;
input CARRYIN;
input C2IN;
input LABCTR1;
input LABCTR2;
input LABCTR3;
input LABCTR4;
input POR;

output SDOUT;
output LEOUT;
output CASCADEOUT;
output CARRYOUT;
output C2OUT;

wire pr100, pr101, pr102, pr103, pr104, pr105, pr106, pr107, pr108,
     pr109, pr110, pr111, pr112, pr113, pr114, pr115;

wire n1, n2, n3, n4, n5, n6, n7, n8, n9, n10, n11, n12
       n13, n14, n15, n16, n18, n19, n20, n21, n22, n23, n24, n25,
       n26, n27, n28, n29, n30, n31, n32, n33, n34, n35, n36, n37,
       n38, n39, n42, n43, n44, n45, n46, n47, n48, n49, n50,
       n51, n52, n53, n54, n55, n56, tocarry1, regoutb, tocas;
```

FIG. 10B supply0 gnd;
supply1 vcc;

mux2_1 i_1 (tocarry1, C2OUT,n55,n29);

not i_59 (tocas, DATA2);

not i_46 (n1, pr100);
not i_45 (n2, pr101);
not i_44 (n3, pr102);
not i_43 (n4, pr103);
not i_42 (n5, pr104);
not i_41 (n6, pr105);
not i_40 (n7, pr106);
not i_39 (n8, pr107);
not i_38 (n9, pr108);
not i_37 (n10, pr109);
not i_36 (n11, pr110);
not i_35 (n12, pr111);
not i_34 (n13, pr112);
not i_33 (n14, pr113);
not i_32 (n15, pr114);
not i_31 (n16, pr115);

mux2_1 i_15 (n1,n2,n18,n19);
mux2_1 i_8 (n3,n4,n18,n20);
mux2_1 i_14 (n5,n6,n18,n21);
mux2_1 i_13 (n7,n8,n18,n22);
mux2_1 i_12 (n9,n10,n18,n23);
mux2_1 i_11 (n11,n12,n18,n24);
mux2_1 i_10 (n13,n14,n18,n25);
mux2_1 i_9 (n15,n16,n18,n26);

mux2_1 i_4 (n19,n20,n54,n27);
mux2_1 i_7 (n21,n22,n54,n28);
mux2_1 i_6 (n23,n24,DATA2,tocarry1);
mux2_1 i_5 (n25,n26,DATA2,C2OUT);

mux2_1 i_3 (n27,n28,n55, n30);

mux2_1 i_60 (n30,n56,DATA4, n31);

mux2_1 i_87 (vcc,n31,n32,n33);

not i_84 (n37,n33);

not i_86 (n34,n36);
not i_85(n35,C2IN);

mux2_1 i_28 (n35,n34,CARRYIN,CARRYOUT);

FIG. 10C

```
iscan i_27 (.DATAIN (n51),
        .SDI    (n39),
            .SCANCLK (SCANCLK),
            .SCANCLKB (SCANCLKB),
            .CAPTURE (CAPTURE),                 832
            .SHIFT (SHIFT),
            .UPDATE (UPDATE),
            .TEST (TEST),
            .NORMAL (NORMAL),
            .SDO   (SDOUT),
            .DATAOUT (regoutb)
            );

iscan i_25 (.DATAIN    (n37),
        .SDI    (n42),
            .SCANCLK (SCANCLK),
            .SCANCLKB (SCANCLKB),
        .CAPTURE (CAPTURE)                      830
        .SHIFT (SHIFT),
        .UPDATE (UPDATE)
            .TEST (TEST),
            .NORMAL (NORMAL),
            .SDO   (n39),
            .DATAOUT (CASCADEOUT)
            );

iscan i_26 (.DATAIN   (tocarry1),
        .SDI    (SDI),
            .SCANCLK (SCANCLK),
            .SCANCLKB (SCANCLKB),
            .CAPTURE (CAPTURE),                 831
            .SHIFT (SHIFT),
            .UPDATE (UPDATE)
            .TEST (TEST)
            .NORMAL (NORMAL)
            .SDO   (n42),
            .DATAOUT    (n36)
            );
```

FIG. 10D

```
not i_83 (n44, n43);
not i_82 (n45, n44);

and i_79 (n46, n45, DATA3);
nor i_62 (n53, n44, DATA3);

nor i_61 (n52, n46, n47, POR);

not i_80 (n49, n48);
not i_81 (n50, n49);

//not i_23 (LEOUT, n40);

not i_88 (n17, regoutb);
not i_89 (n40, regoutb);

wire dummy;

leff i_29 (.DATAIN (CASCADEOUT),
        .CLEAR     (n52),
         .PRESET    (n53),
         .CLK       (n50),
         .CLKB      (n49),
         .DATAOUT (dummy),
         .DATAOUTB (n51)
         );
```

```
//assign pr100 = gnd;      //<LUT15ZERO>
//assign pr100 = vcc;      //<LUT15ONE>

//assign pr101 = gnd;      //<LUT14ZERO>
//assign pr101 = vcc;      //<LUT14ONE>

//assign pr102 = gnd;      //<LUT13ZERO>
//assign pr102 = vcc;      //<LUT13ONE>

//assign pr103 = gnd;      //<LUT12ZERO>
//assign pr103 = vcc;      //<LUT12ONE>

//assign pr104 = gnd;      //<LUT11ZERO>
//assign pr104 = vcc;      //<LUT11ONE>

//assign pr105 = gnd;      //<LUT10ZERO>
//assign pr105 = vcc;      //<LUT10ONE>

//assign pr106 = gnd;      //<LUT9ZERO>
//assign pr106 = vcc;      //<LUT9ONE>

//assign pr107 = gnd;      //<LUT8ZERO>
//assign pr107 = vcc;      //<LUT8ONE>

//assign pr108 = gnd;      //<LUT7ZERO>
//assign pr108 = vcc;      //<LUT7ONE>

//assign pr109 = gnd;      //<LUT6ZERO>
//assign pr109 = vcc;      //<LUT6ONE>

//assign pr110 = gnd;      //<LUT5ZERO>
//assign pr110 = vcc;      //<LUT5ONE>

//assign pr111 = gnd;      //<LUT4ZERO>
//assign pr111 = vcc;      //<LUT4ONE>

//assign pr112 = gnd;      //<LUT3ZERO>
//assign pr112 = vcc;      //<LUT3ONE>

//assign pr113 = gnd;      //<LUT2ZERO>
//assign pr113 = vcc;      //<LUT2ONE>

//assign pr114 = gnd;      //<LUT1ZERO>
//assign pr114 = vcc;      //<LUT1ONE>

//assign pr115 = gnd;      //<LUT0ZERO>
//assign pr115 = vcc;      //<LUT0ONE>
```

FIG. 10F

//assign (strong1, strong0) n18 = DATA1;          //<QNORM>
//assign (strong1, strong0) n18 = n17;             //<QUPDWN>

//assign (strong1, strong0) n54 = DATA1;          //<RUPDWN>
//assign (strong1, strong0) n54 = DATA2;          //<RNORM>

//assign (strong1, strong0) n55 = DATA3;          //<PNO_CI>
//assign (strong1, strong0) n55 = CARRYIN;    //<PCI>

//assign (strong1, strong0) n56 = n29;             //<SNORM>
//assign (strong1, strong0) n56 = DATA3;          //<SUPDWN>

//assign n32 = vcc;                                //<NVCC>
//assign (strong1, strong0) n32 = CASCADEIN;      //<NCASCIN>
//assign (strong1, strong0) n32 = tocas;          //<NMODE>

//assign (strong1, strong0) LEOUT = n40;          //<KREG>
//assign (strong1, strong0) LEOUT = CASCADEOUT;   //<KUNREG>

//assign n43 = LABCTR1;                           //<JPRE>
//assign n43 = gnd;                                //<JPRENOT>

//assign (strong1, strong0) n47 = LABCTR1;//<MCT1>
//assign (strong1, strong0) n47 = LABCTR2;//<MCT2>

//assign (strong1, strong0) n48 = LABCTR3;//<LCT3>
//assign (strong1, strong0) n48 = LABCTR4;//<LCT4>
//assign n48 = gnd;                                //<LGND> endmodule

FIG. 11

```
BEGINDEVICE
DEVICE=500

.
.
.

LB,3,2,LE2,<QNORM>=T
LB,3,2,LE2,<QUPDWN>=F
LB,3,2,LE2,<RUPDWN>=F
LB,3,2,LE2,<RNORM>=T
LB,3,2,LE2,<PNO_CI>=T
LB,3,2,LE2,<PCI>=F
LB,3,2,LE2,<SNORM>=T
LB,3,2,LE2,<SUPDWN>=F
LB,3,2,LE2,<NVCC>=T
LB,3,2,LE2,<NCASCIN>=F
LB,3,2,LE2,<NMODE>=F
LB,3,2,LE2,<KREG>=T
LB,3,2,LE2,<KUNREG>=F
LB,3,2,LE2,<JPRE>=F
LB,3,2,LE2,<JPRENOT>=T
LB,3,2,LE2,<MCT1>=F
LB,3,2,LE2,<MCT2>=T
LB,3,2,LE2,<LCT3>=F
LB,3,2,LE2,<LCT4>=F
LB,3,2,LE2,<LGND>=T

.
.
.

ENDDEVICE
```

```
  assign (strong1, strong0) n18 = DATA1;           //<QNORM>
//assign (strong1, strong0) n18 = n17;             //<QUPDWN>

//assign (strong1, strong0) n54 = DATA1;           //<RUPDWN>
  assign (strong1, strong0) n54 = DATA2;           //<RNORM> assign (strong1, strong0) n55 = DATA3;           //<PNO_CI>
//assign (strong1, strong0) n55 = CARRYIN;         //<PCI> assign (strong1, strong0) n56 = n29;             //<SNORM>
//assign (strong1, strong0) n56 = DATA3;           //<SUPDWN>

//assign n32 = vcc;                                //<NVCC>
//assign (strong1, strong0) n32 = CASCADEIN; //<NCASCIN>
  assign (strong1, strong0) n32 = tocas;   //<NMODE> assign (strong1, strong0) LEOUT = n40;           //<KREG>
//assign (strong1, strong0) LEOUT = CASCADEOUT; //<KUNREG> assign n43 = LABCTR1;                            //<JPRE>
//assign n43 = gnd;                                //<JPRENOT>

//assign (strong1, strong0) n47 = LABCTR1;    //<MCT1>
//assign (strong1, strong0) n47 = LABCTR2;    //<MCT2>

//assign (strong1, strong0) n48 = LABCTR3;    //<LCT3>
//assign (strong1, strong0) n48 = LABCTR4;    //<LCT4>
  assign n48 = gnd;                                //<LGND> endmodule
```

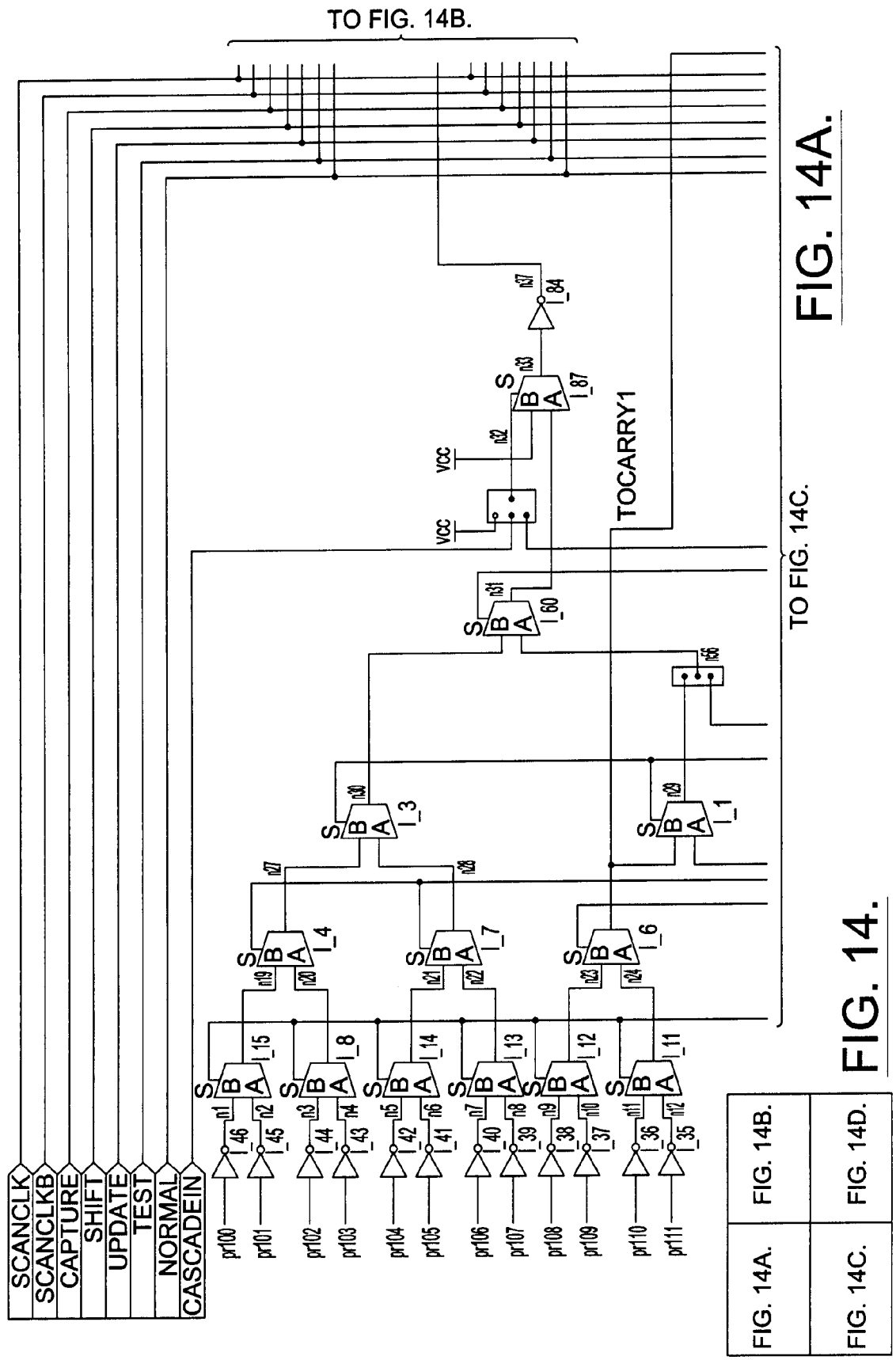

DESIGNING INTEGRATED CIRCUIT GATE ARRAYS USING PROGRAMMABLE LOGIC DEVICE BITSTREAMS

FIELD OF THE INVENTION

The present invention relates to integrated circuit design methods, and more particularly to application specific integrated circuit design methods.

BACKGROUND OF THE INVENTION

Integrated circuit designers frequently choose application specific integrated circuit (ASIC) technology when designing integrated circuits to perform unique and customized functions. This is because ASIC technology provides designers with comprehensive tools to customize logic to perform specialized and multiple functions on a single integrated circuit substrate or chip, instead of the multiple chips which typically would be required in the event standardized circuit technology was employed. As will be understood by those skilled in the art, ASICs may be generated in many different ways and have many different designations based on the methods used to design and/or manufacture them. The most time consuming method, but often the one that yields the smallest chip size and/or best performance, is the "full-custom" designed ASIC. These ASICs are often designed entirely from scratch at the transistor level with only occasional use of previously designed circuit "blocks" which are typically referred to as cells, standard cells, or macrocells. Because of this comprehensive approach, custom designed ASICs typically require the creation of an entire design database and test methods (including custom test vectors). A complete set of customized fabrication masks is also typically required for fabrication. These requirements typically make the design and fabrication of custom ASICs very time consuming and expensive when generating prototype devices and when iterating through design changes. Alternative ASIC design methodologies include the use of standard cell technology, which differs from full custom design in that multiple cells or macrocells that have been previously designed are utilized. These cells are selected from libraries of cells for their applicability to the design, and placed and routed with software that is well known in the art. The final circuit then has no fewer custom mask layers than the full custom design method. However, this method does have advantages over the full custom design method in the time required to complete a design, because the elementary level of cell design is only done once to create the libraries, and this work can be reused in multiple subsequent designs.

Alternative application specific integrated circuit design technologies which typically do not incur the time and expense penalties associated with full custom ASICs include gate array technology. Gate array technology typically utilizes the building blocks of logic gates and/or memory devices as resources to minimize design time and cost. This extensive use of blocks enables the gate array designer to focus more on the routing of connections (e.g., metal wiring and interconnects) between these blocks and less on the design and operation of the individual logic gates and other low-level devices. Here, the designer may be able to reduce the number of custom mask layers that must be generated for fabrication because typically only the uppermost masking layers are specific to a particular design. On the other hand, the base masking layers that determine the logic and memory blocks are typically identical for a variety of designs. With these savings comes a penalty since only certain types and sizes of logic gates are typically available to choose from and constraints on the placement of such gates may not always lead to a device having ideal characteristics.

Gate array technology also provides a reduction in the time and expense associated with making design changes through an iterative process. This is because less than all mask layers are involved in any design change at any level, as opposed to the full-custom ASIC design case where design changes may require a change to all mask layers. Notwithstanding these benefits, gate array technology may still require some relatively expensive custom tooling for the upper level masks. Moreover, design checking in physical silicon cannot take place without processing one or more wafers through multiple fabrication steps including deposition, masking and etching, for example, just like full-custom ASIC technology. The terms ASIC and gate array are meant to be interchangeable for the purposes of this disclosure. ASIC or gate array can refer to fully-custom integrated circuits, or semi-custom integrated circuits, including standard cell integrated circuits.

Referring now to FIG. 1, a flow diagram of operations 100 performed when designing a full-custom ASIC will be described. Although the flow diagram displays many decision points and their associated unacceptable paths, the following description does not attempt to elaborate on all the unacceptable paths. As illustrated, a design specification of a desired integrated circuit is initially provided, Block 102, and then from this a HDL/schematic description of the integrated circuit is entered into a design system, Block 104, to generate a complete HDL/schematic description, Block 106. From this HDL/schematic description, an operation is performed to simulate the functional operation of the integrated circuit, Block 108. The simulation is then checked for accuracy, Block 110. If the simulation is correct, an operation is performed to synthesize logic and generate a logic netlist, Blocks 112 and 114. The synthesis of the logic may require ASIC logic primitives and resources, Block 113, and user synthesis constraints, Block 111. A check may then be performed to determine whether the integrated circuit will receive an internal scan test, Block 116. If so, scan elements can be added to the logic netlist, Block 118. Then, with the addition of ASIC element timing estimates, Block 115, an operation is performed to simulate the timing of the integrated circuit, Block 121. The timing simulation is then checked for accuracy, Block 123. If the simulation is correct, a logic placement and signal routing operation will be performed, Block 120, based on a set of user routing and logic placement constraints, Block 150, and ASIC logic resources and routing resources and constraints, Block 117. From this placement and routing operation, a routed netlist will be generated, Block 122.

A timing extraction operation (e.g., parasitic R and C extraction operation) may then be performed, Block 124, to generate timing parameters, Block 126. The routed netlist and timing parameters are then used to perform another timing simulation, Block 128, which takes into account the actual placement of gates, devices, etc., and interconnect nets which link these devices together. A check is then performed to determine whether the simulation is acceptable, Block 130. If the simulation is acceptable, test vectors are created, Block 140. Operations are also performed to create mask-making data, Block 132. The mask-making data, Block 134, is then used to create masks, Block 136. A prototype of the full-custom ASIC device is then fabricated, Block 138. An operation is then performed to test and evaluate the device and/or system, Block 142. If the test results are acceptable, then the design is complete. However, if the test results are not acceptable, then a check is made to determine whether the HDL/schematic description of the invention (i.e. logic) needs to be modified, the routing and placement needs to be modified, or the synthesis constraints need to be modified, Block 144. If the HDUschematic description needs to be modified, Block 146, then essentially all the above-described steps and operations will need to be repeated. If the synthesis constraints need to be modified, Block 119, then the majority of the above-described steps and operations will need to be repeated from the logic synthesis step, Block 112. But, if only the routing and placement constraints need to be modified, Block 148, then the process can resume at the logic placement and signal routing step, Block 120.

Programmable logic devices (PLDs) may also be used as an alternative application specific integrated circuit design technology. Such devices are also typically referred to as programmable array logic (PAL) and field programmable gate arrays (FPGAs), as described in Chapter 11 of a textbook by Jan M. Rabaey, entitled Digital Integrated Circuits, Prentice Hall, pp. 629–692 (1996), the disclosure of which is hereby incorporated herein by reference. When customizing a PLD, a user typically defines the device within the constraints of the PLD architecture, and then creates through the use of computer aided design tools, a specific set of interconnections or device states at each of the programmable configuration points within the PLD. As will be understood by those skilled in the art, each of these configuration points may be controlled by one or more fuses, antifuses or memory elements, and may be one-time programmable or reprogrammable. The configuration of the PLD is then stored in a configuration file, which is commonly referred to as a "bitstream". This configuration file defines the state of each fuse, antifuse or memory element in the PLD. In the case of PLDs, this bitstream may be programmed into the PLD directly, or in the case of a volatile device, this bitstream may be stored in another device and then read into the PLD upon startup.

An obvious advantage of PLDs is that they require relatively little time and expense to design or generate design iterations. However, for a given functional design, PLDs typically require greater layout area, consume considerably more power and are slower than ASIC technologies (i.e. custom ASIC, standard cell, or gate array). PLDs consume more power and are slower because the signals which traverse programmable elements within the PLD typically encounter higher resistance and capacitance associated with the programmable elements than the resistance and capacitance associated with metal interconnect lines within the gate array and full-custom ASIC technologies. PLDs also require greater layout area because they include additional programmable elements and configuration points.

Referring now to FIG. 2, a flow diagram of operations 200 performed when designing a conventional PLD will be described. As illustrated, a design specification of a desired integrated circuit is initially provided, Block 202, and then from this a HDUschematic description of the integrated circuit is entered into a design system, Block 204, to generate a complete HDL/schematic description, Block 206. From this HDUschematic description, an operation is performed to simulate the functional operation of the integrated circuit, Block 208. The simulation is then checked for accuracy, Block 210. If the simulation is correct, an operation is performed to synthesize logic and generate a logic netlist, Blocks 212 and 214. The synthesis of the logic typically requires PLD logic primitives and resources, Block 213. A logic placement and signal routing operation is then performed, Block 220, based on a set of user routing and logic placement constraints, Block 250, and PLD logic resources and routing resources and constraints, Block 217. From this placement and routing operation, a routed netlist will be generated, Block 222.

A timing extraction operation may then be performed, Block 224, to generate timing parameters, Block 226. The routed netlist and timing parameters are then used to perform a timing simulation, Block 228, which takes into account the actual placement of gates, devices, etc., and interconnect nets which link these devices together. A check is then performed to determine whether the simulation is acceptable, Block 230. If the simulation is acceptable, an operation is performed to generate a bitstream/programming file, Blocks 232 and 234. A prototype of the PLD can then be programmed, Block 236. An operation is then performed to test and evaluate the operation and/or system of the device, Block 242. If the test results are acceptable, then the design of the PLD is complete. However, if the test results are not acceptable, then a check is made to determine whether the HDL schematic description of the circuit needs to be modified or the routing and placement needs to be modified, Block 244. If the HDL schematic description needs to be modified, Block 246, then essentially all the above-described steps and operations of FIG. 2 will need to be repeated. But, if only the routing and placement constraints need to be modified, Block 248, then the process can resume at the logic placement and signal routing step, Block 220.

Unfortunately, as integrated circuit designs such as those having asynchronous inputs increasingly become more complex, the importance of physical testing becomes more important since many of state-of-the-art software simulation tools cannot provide completely accurate simulation. Accordingly, physical designs may need to be redesigned in an iterative manner more frequently, which increases design time and expense. To address these limitations in the ability to accurately and completely simulate highly complex integrated circuits, integrated circuit design methodologies have been developed which include the generation of prototype devices and the performance of small volume production with PLDs. Then, once a final functional design is obtained utilizing the PLD, a conversion is then typically made to full-custom or gate array ASICs for large volume production after the design has been finalized. Unfortunately, a problem with this design methodology is the lack of an efficient technique to provide this conversion from a PLD to a gate array or full-custom ASIC without having to go back to the beginning or HDL/schematic definition stage and repeat the time-consuming and expensive process of generating the gate array or full-custom ASIC to mimic the operation of the PLD. Thus, when switching from a functional PLD implementation to a gate array ASIC implementation, the design process essentially starts over since the logic synthesis operations must be repeated along with the place and route operations and all the other steps in the flow.

This relatively inefficient design methodology is more fully illustrated by FIG. 3. In particular, FIG. 3 illustrates conventional operations 300 which are performed when switching from a PLD implementation to an ASIC implementation. Although the flow diagram displays many decision points and their associated unacceptable paths, the following description does not attempt to elaborate on all the unacceptable paths. These operations include the step of selecting a PLD for conversion, Block 302, with the description of the PLD being defined by a HDUschematic description, Block 304. A check is then made to determine whether the HDL/schematic format of the PLD is compatible with the format for specifying an ASIC, Block 306. If the formats are not compatible, then the HDL/schematic of the PLD undergoes a conversion process, Block 308, to generate a converted format for the desired ASIC, Block 349. From this HDL/schematic description, an operation is performed to simulate the functional operation of the integrated circuit, Block 350. The simulation is then checked for accuracy, Block 352. If the simulation is correct, an operation is performed to synthesize logic and generate a logic netlist, Blocks 312 and 314. The synthesis of the logic may require ASIC logic primitives and resources, Block 313, and the user synthesis constraints, Block 311. A check may then be performed to determine whether the integrated circuit will receive an internal scan test, Block 316. If so, scan elements will be added to the logic netlist, Block 320. Then, with the addition of the ASIC element timing estimates, Block 315, an operation is performed to simulate the timing of the integrated circuit, Block 317. The timing simulation is then checked for accuracy, Block 323. If the timing simulation is not correct, a check is made at Block 343 to determine whether the synthesis constraints need to be modified, Block 325, or whether the logic needs to be modified. However, if the simulation is correct, a logic placement and signal routing operation will be performed, Block 318, based on a set of user routing and logic placement constraints, Block 321, and ASIC logic resources and routing resources and constraints, Block 319. From this placement and routing operation, a routed netlist will be generated, Block 322.

A timing extraction operation (e.g., parasitic R and C extraction operation) may then be performed, Block 324, to generate timing parameters, Block 326. The routed netlist and timing parameters are then used to perform another timing simulation, Block 328, which takes into account the actual placement of gates, devices, etc., and interconnect nets which link these devices together. A check is then performed to determine whether the simulation is acceptable, Block 330. If the simulation is acceptable, test vectors are created, Block 342. Operations are also performed to create mask-making data, Block 332. The mask-making data, Block 334, is then used to create masks, Block 336. A prototype of the ASIC device is then fabricated, Block 338. An operation is then performed to test and evaluate the operation of the device and/or the device within the application, Block 340. If the test results are acceptable, then the design is complete. However, if the test results are not acceptable, then a check is made to determine whether the HDL/schematic description of the invention (i.e. logic) needs to be modified, the routing and placement needs to be modified, or the synthesis constraints need to be modified, Block 344. If the HDL schematic description needs to be modified, Block 346, then essentially all the above-described steps and operations will need to be repeated. If the synthesis constraints need to be modified, Block 325, then the majority of the above-described steps and operations will need to be repeated from the logic synthesis step, Block 312. But, if only the routing and placement constraints need to be modified, Block 348, then the process can resume at the logic placement and signal routing step, Block 318.

Alternative methods of converting PLDs to ASICs have been devised that reduce the workload in the conversion process by creating parameterized software models for elements of the PLD such as described in U.S. Pat. No. 5,815,405 to Baxter titled "Method and apparatus for converting a programmable logic device representation of a circuit into a second representation of the circuit". These methods attempt to allow the reuse of work product in the same way that standard cell ASIC technology allows the reuse of work product. Standard cell ASIC technology reuses previously created cells or macrocells and allows the designer to reuse these higher level previously designed building blocks, lessening the design effort over full custom design. In the same way, Baxter proposes reusing previously designed software macros of the logic elements within the PLD, and creating a software model of the design from the bitstream of the PLD, relieving the designer of these repetitive tasks. These methods however still suffer from the limitations that they require the user to complete the multiple steps of synthesis and place and route after the software model has been created, and do not guarantee that equivalent logic implementation and timing, or relative placement and relative routing delays of signals will be maintained between the target PLD representation being converted and the ASIC device as converted.

In particular, U.S. Pat. No. 5,815,405 to Baxter discloses an apparatus which parses a device specific bitwise representation used to program a PLD. The apparatus identifies various configurable elements being programmed by the bitwise representation, and identifies the actual configuration of the identified elements. As illustrated by FIG. 1B of the '405 patent, for each configurable element represented in the bitwise representation, a new instance of that type of element is included in a pre-compiled representation 137 of the circuit design. This pre-compiled representation, which is independent of the target fabrication technology, may be an HDL representation or a netlist representation. A compiler then uses a target fabrication technology library 142 to convert the pre-compiled representation 137 into a post-compiled representation 147. A place and route tool 150 is then used to place and route the post-compiled representation 147 in the desired target technology. Unfortunately, like the relatively inefficient design methodology of FIG. 3, expensive and time consuming operations are still required to convert from an HDL or netlist representation of the desired circuit to a design which is compatible with the target technology. Conventional place and route operations are also required.

Thus, notwithstanding the above-described techniques for designing integrated circuits, there still continues to be a need for design techniques which enable more efficient conversion of PLD-based designs to functionally equivalent ASIC designs.

SUMMARY OF THE INVENTION

It is therefore an object of the present invention to provide improved integrated circuit design and manufacturing methodologies.

It is another object of the present invention to provide integrated circuit design and manufacturing methodologies which enable a more efficient conversion from PLD integrated circuits to gate array integrated circuits.

It is still another object of the present invention to provide integrated circuit design and manufacturing methodologies which maintain functional equivalency when converting from PLD integrated circuits to gate array integrated circuits.

It is still a further object of the present invention to provide integrated circuit design and manufacturing methodologies which enable replication of the functionality of a PLD in a gate array integrated circuit, without requiring the synthesis or the placement and routing steps which are typically required when starting from an HDL or schematic entry level of a circuit design.

These and other objects, features and advantages of the present invention are provided by methods of designing integrated circuit devices which comprise the step of generating a netlist for a gate array,integrated circuit having at least first logic and signal resources therein, directly from bitstream data which characterizes a programmable logic device having a first operational functionality and the first logic and signal resources as well. The generating step is also followed by the step of using the netlist to configure the first logic and signal resources within the gate array integrated circuit to provide the first functionality. A preferred integrated circuit design system is also provided. This system includes a programmable logic device having unprogrammed logic and signal resources therein and a gate array device having base logic and signal resources therein which are equivalent to the unprogrammed logic and signal resources of the programmable logic device. A computer-based apparatus is also provided for decoding a bitstream that characterizes the programmable logic device having a first operational functionality when programmed, into a netlist that designates electrical connections in the gate array device when wired to have the first operational functionality. Accordingly, when switching from a functional programmable logic device (PLD) implementation to a gate array implementation, it is unnecessary to start the design process over from scratch by performing logic synthesis, place and route and other front end design operations associated with conventional gate array design techniques.

According to one aspect of the present invention, the generating step comprises the step of generating a netlist for the gate array integrated circuit having a first operational functionality. The generating step may also make use of definition data for the programmable logic device, and may further make use of definition data for the gate array integrated circuit. The netlist may be further used to generate test vectors for a test of operational functionality of the gate array integrated circuit. The test of operational functionality may include scan-based testing.

According to another aspect of the present invention, the generating step comprises the step of generating hookup data which characterizes a plurality of nets for a gate array integrated circuit having a first operational functionality. Preferentially, this generating step would not require a logic synthesis operation or placement and/or routing steps. The generating step may also make use of definition data for the programmable logic device, and may further make use of definition data for the gate array integrated circuit. In another embodiment of the present invention, hookup coordinates are generated as an output of the generating step, which may also include the use of definition data for the programmable logic device or the gate array integrated circuit or both. The hookup coordinates may define points of electrical connections, disconnections or both. The creation of the connections or disconnections may make use of a targeting energy beam, such as an electron beam, ion beam, laser, or other similar methods, hereinafter referred to as a laser, or may make use of photolithography, etch, plating, and deposition technology which is well known in the art, wherein the pattern locations created by the laser or photomask are designated by the hookup coordinates.

BRIEF DESCRIPTION OF THE DRAWINGS

FIG. 6 is a diagram of a bitstream file used to program the exemplary PLD.

FIG. 7 is an exemplary table of bitstream bits and their logical implications used in converting an exemplary PLD directly into a gate array in accordance with the present invention.

FIG. 8 is an exemplary table of logic block coordinates of a gate array device used in converting an exemplary PLD directly into a gate array in accordance with the present invention.

FIG. 9 is an exemplary table of logic element hookup coordinates within a logic block of a gate array device used in converting an exemplary PLD directly into a gate array in accordance with the present invention.

FIG. 10A is a first portion of a base gate array simulation model for use in creating test vectors when converting an exemplary PLD directly into a gate array in accordance with the present invention.

FIG. 10B is a second portion of a base gate array simulation model for use in creating test vectors when converting an exemplary PLD directly into a gate array in accordance with the present invention.

FIG. 10C is a third portion of a base gate array simulation model for use in creating test vectors when converting an exemplary PLD directly into a gate array in accordance with the present invention.

FIG. 10D is a fourth portion of a base gate array simulation model for use in creating test vectors when converting an exemplary PLD directly into a gate array in accordance with the present invention.

FIG. 10E is a fifth portion of a base gate array simulation model for use in creating test vectors when converting an exemplary PLD directly into a gate array in accordance with the present invention.

FIG. 10F is a sixth portion of a base gate array simulation model for use in creating test vectors when converting an exemplary PLD directly into a gate array in accordance with the present invention.

FIG. 11 is a portion of a connection/configuration data file for use in directly converting an exemplary PLD directly into a gate array in accordance with the present invention.

FIG. 12 is a portion of a modified gate array simulation model for use in creating test vectors when converting an exemplary PLD directly into a gate array in accordance with the present invention.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 5A:
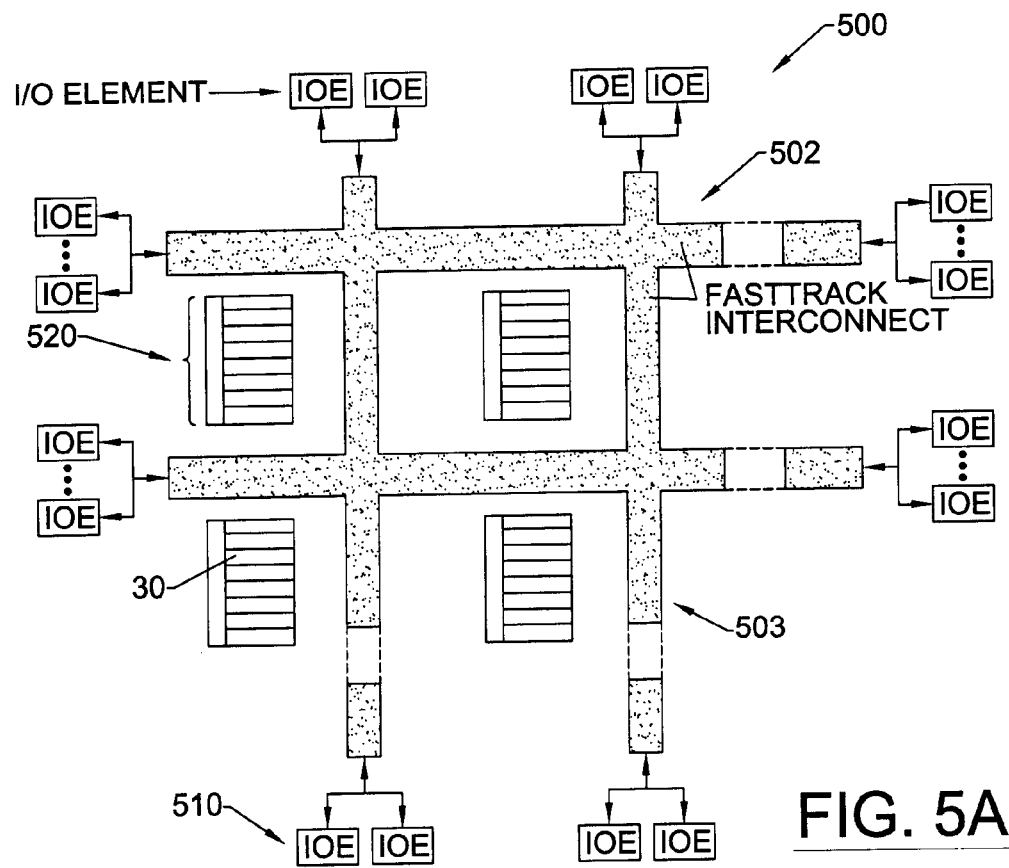
FIG. 5A is a block diagram of an exemplary PLD which can be converted directly to a gate array in accordance with the present invention.

FIG. 5A illustrates a PLD device 500 of a type manufactured by Altera Corporation of San Jose, Calif., which can be converted directly to a gate array in accordance with the present invention. Device 500 has a row and column architecture, with multiple I/O elements 510 on four sides connected to row 502 and column 503 interconnects, with logic blocks (LBs) 520 disposed along the rows and columns in a two dimensional format. Each LB 520 contains 8 logic elements (LEs) 30 and has multiple interconnections to its adjacent row interconnect 502 and column interconnect 503, as illustrated in FIG. 5B. Control signals 540 are derived from row interconnect 502. Local interconnect 550 allows input lines 560 to LE 30 be drawn from row interconnect 502 or from feedback bus 570 made up of the eight LE-Out lines 14 from each of the logic elements 30 in the logic block.

Figure 5C:
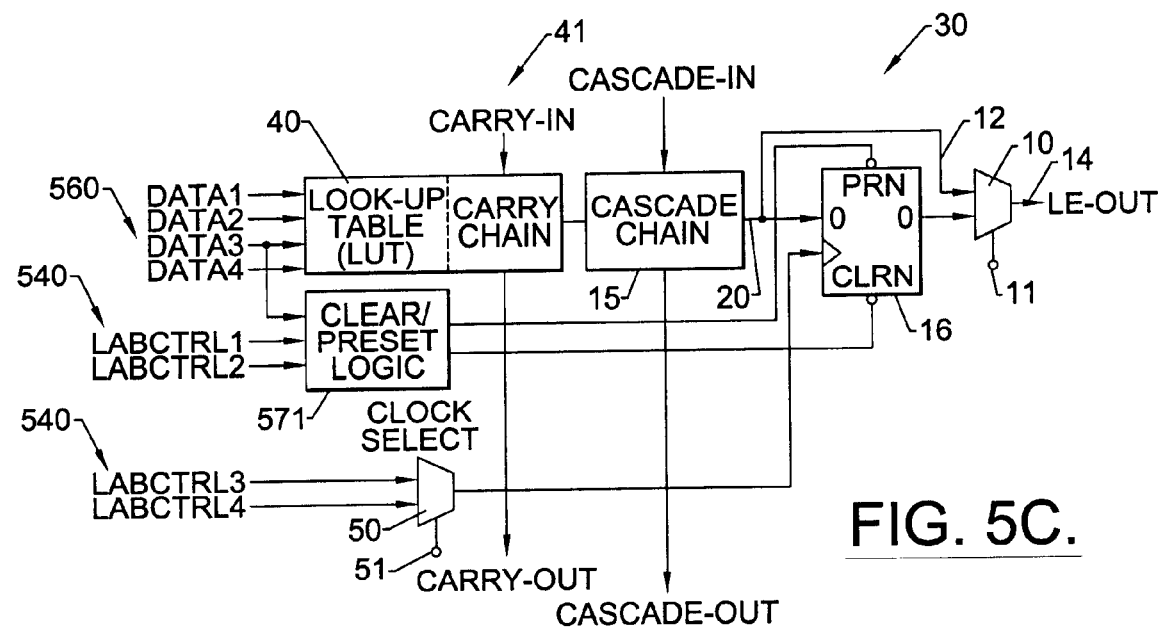
FIG. 5C is a block diagram of a second portion of the exemplary PLD shown in FIG. 5B.
Figure 5B:
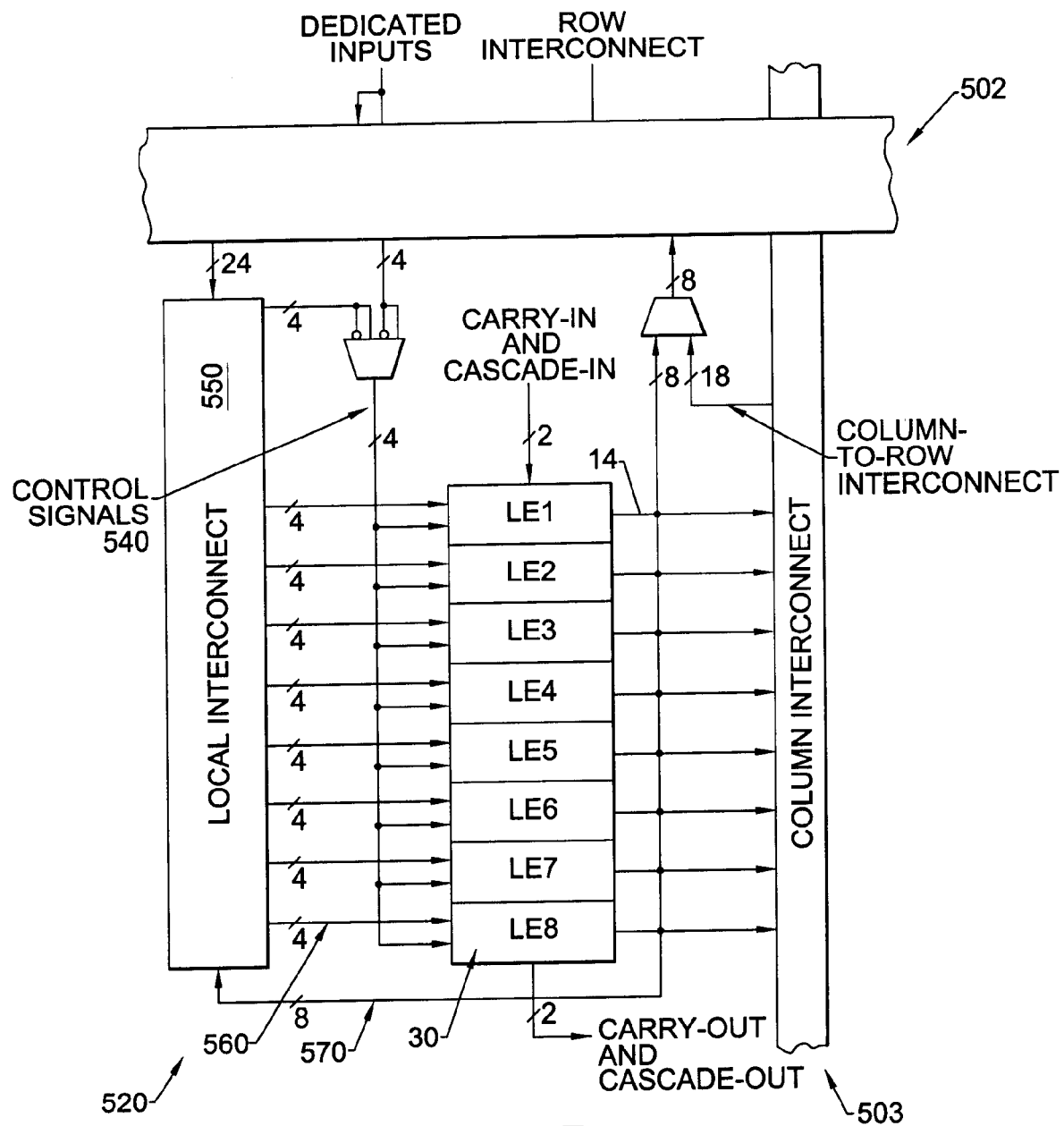
FIG. 5B is a block diagram of a first portion of the exemplary PLD shown in FIG. 5A.

FIG. 5C shows a block diagram of exemplary logic element 30 containing look-up table 40, fed by four LE input lines 560 and Carry-in line 41, cascade chain logic 15, register 16, register bypass circuit 12, and LE-Out MUX 10 controlled by logic state 11 and yielding LE-Out line 14. Logic element 30 also contains clock select MUX 50 controlled by logic state 51 and selecting one of two LE control signals 540 to go into register 16. Clear/Preset logic 571 uses one of the four LE input lines 560 and two of the four LE control signals 540 to determine the states of preset and clear on register 16. This exemplary portion is a logic element of a FLEX 8000 architecture used in PLDs manufactured by Altera Corporation of San Jose, Calif. PLD devices are manufactured with different fundamental logic architectures, the two most popular of which are the lookup-table architecture, and the product-term architecture. Examples of lookup-table architecture are devices such as the FLEX 8000 family manufactured by Altera Corporation of San Jose, Calif., and the XC4000 family manufactured by Xilinx, Inc. of San Jose, Calif. Examples of product-term architecture are the MAX 7000 family manufactured by Altera Corporation, and the XC9500 family manufactured by Xilinx, Inc. In one aspect of the present invention, it is advantageous for the base gate array device into which the PLD device is to be converted to have the same architecture type, such that if the PLD to be converted has an architecture containing logic elements made up of a four input lookup table, cascade logic, a register, a register bypass path, and arithmetic carry capability, then the base gate array device into which the PLD is to be converted should have blocks containing the same or equivalent elements. Likewise, if the PLD to be converted contains macrocells with five product terms each with thirty-six input terms feeding an OR gate, a register, product term sharing logic, and a register bypass path, then the base gate array device into which the PLD is to be converted should have blocks containing the same or equivalent elements. Since this will also allow segments of logic in the PLD, when converted and placed into the gate array device, to be in the same relative locations as they occupied in the PLD. In this way internal logic placement and routing can most easily be matched, and internal timing and logic consistency can be most easily maintained, without need of logic resynthesis, or placement and routing steps.

Figure 5D:
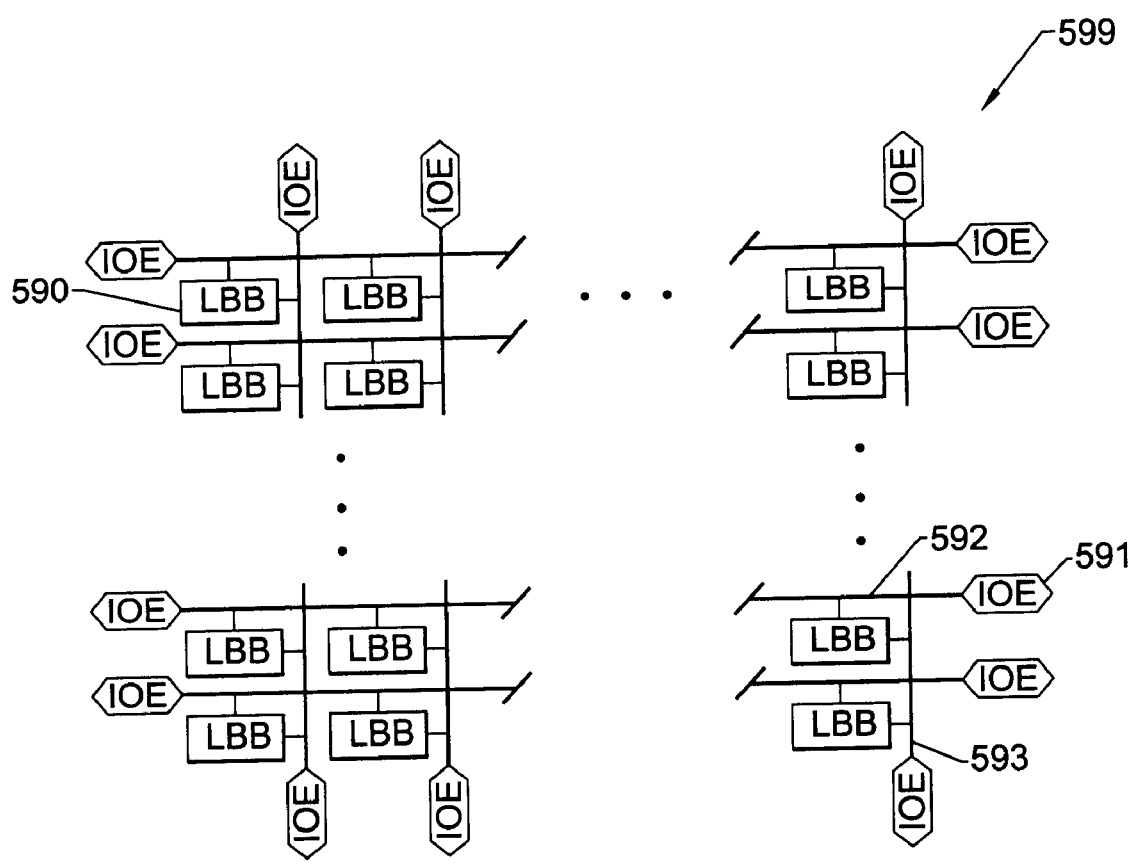
FIG. 5D is a block diagram of a portion of a base gate array device into which an exemplary PLD can be directly converted in accordance with the present invention.
Figure 13:
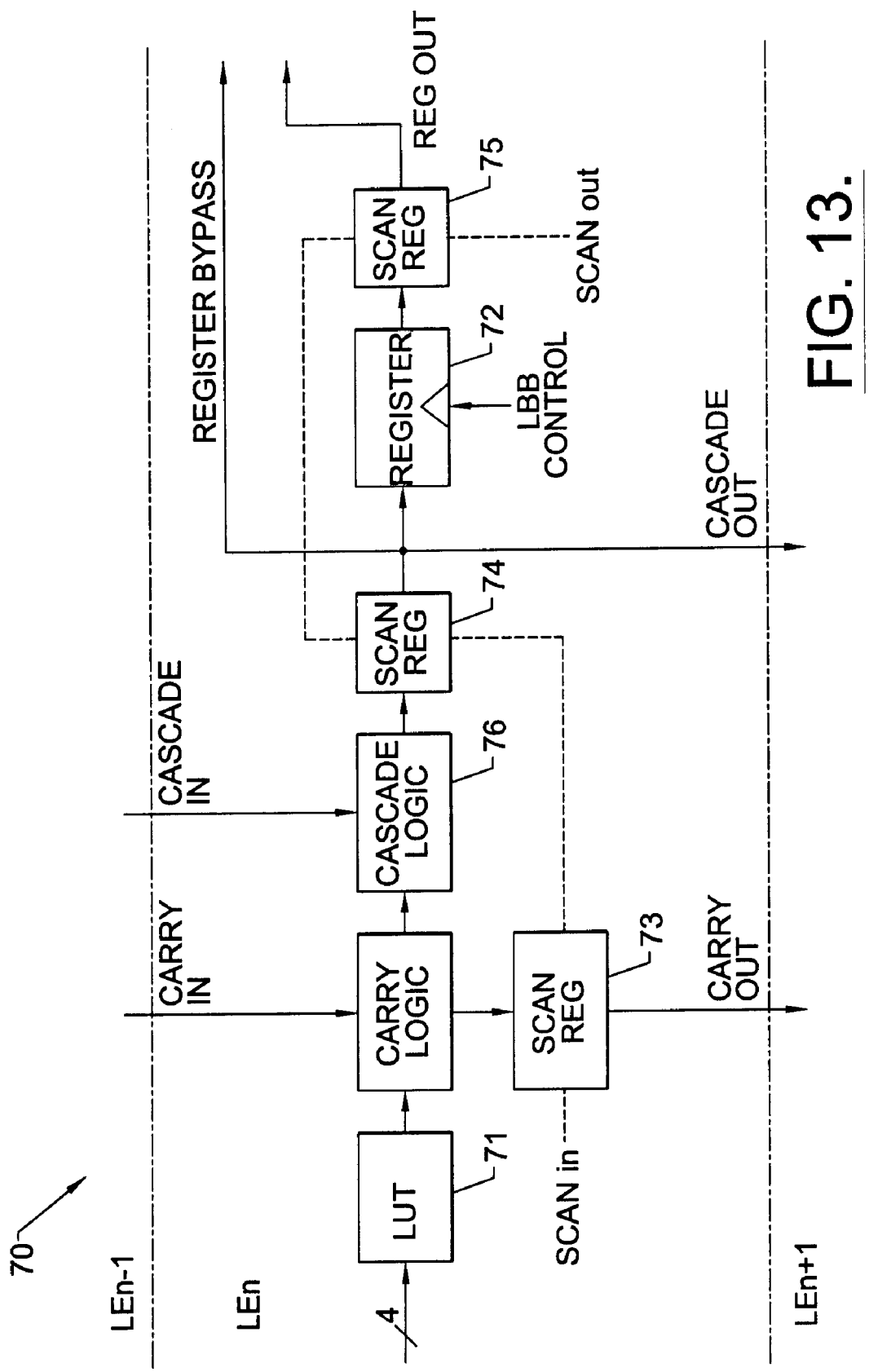
FIG. 13 is a block diagram of a portion of a base gate array device into which an exemplary PLD can be directly converted in accordance with the present invention.

FIG. 5D is a block diagram of such a base gate array device 599 into which PLD device 500 with a first operational functionality can be directly converted, to yield a gate array device with the first operational functionality. Base gate array device 599 contains at least the logic resources and signal path resources present in PLD device 500. Each logic building block 590 of base gate array device 599 contains eight gate array logic element sections 70 (as shown in FIG. 13), each corresponding to logic elements 30 of PLD device 500. The device contains I/Q elements (IOE) 591 containing multiple I/Os, connected to row 592 and column 593 interconnect structures, corresponding to like elements 510, 502, and 503 of PLD device 500. It is a feature of the present invention that the congruence of logic resources and signal path resources of PLD device 500 and base gate array device 599, allows a high efficiency of conversion when PLD device 500 with a first operational functionality is converted to a gate array device with the same first operational functionality. It can be noted that the congruence of logic and signal path resources of PLD device 500 and base gate array device 599 include such things as the row and column architecture of elements 502, and 503 to 592 and 593, and the relative placement of major logic blocks such as LB 520 and LBB 590. Interconnect structures of the base gate array device 599, such as row 592 and column 593 interconnects should have at least the signal path resources of corresponding row 502 and column 503 interconnect structures of PLD device 500. It is less important that the congruence extend to the physical placement of elements 30 within block 520 compared to the placement of sections 70 within blocks 590. It would be perfectly acceptable for elements 30 to be stacked eight high in a vertical arrangement in block 520 of PLD device 500, while logic element sections 70 of LBB 590 of base gate array device 599 were disposed in a two by four matrix. This is due to the relative importance of distance and length of signal line in determining signal delays on an integrated circuit. It will be understood by one skilled in the art that the relative signal delays between logic elements 30 within the same LB 520 will be small in comparison to the signal delays generally encountered between logic blocks 520 located in different areas of PLD device 500.

FIG. 13 is a block diagram of a gate array logic element section 70 of a base gate array device 599, corresponding to the logic element 30 of PLD device 500 shown in FIG. 5C, which is suitable for direct conversion using the invention described herein from the PLD device 500 into the corresponding gate array device 599. It can be seen that the base gate array logic element section 70 also contains similar logic resources and signal path resources to logic element 30 of PLD device 500. Among these are lookup-table (LUT) 71 corresponding to the lookup-table 40 of PLD logic element 30, cascade logic 76 corresponding to similar logic 15 in logic element 30, and a register 72 to correspond with register 16 of logic element 30. FIG. 13 also shows that a logic element section 70 of a base gate array 599 in accordance with one aspect of this invention has the addition of multiple internal scan registers 73, 74, and 75 for use in testing the completed device.

Figure 14B:
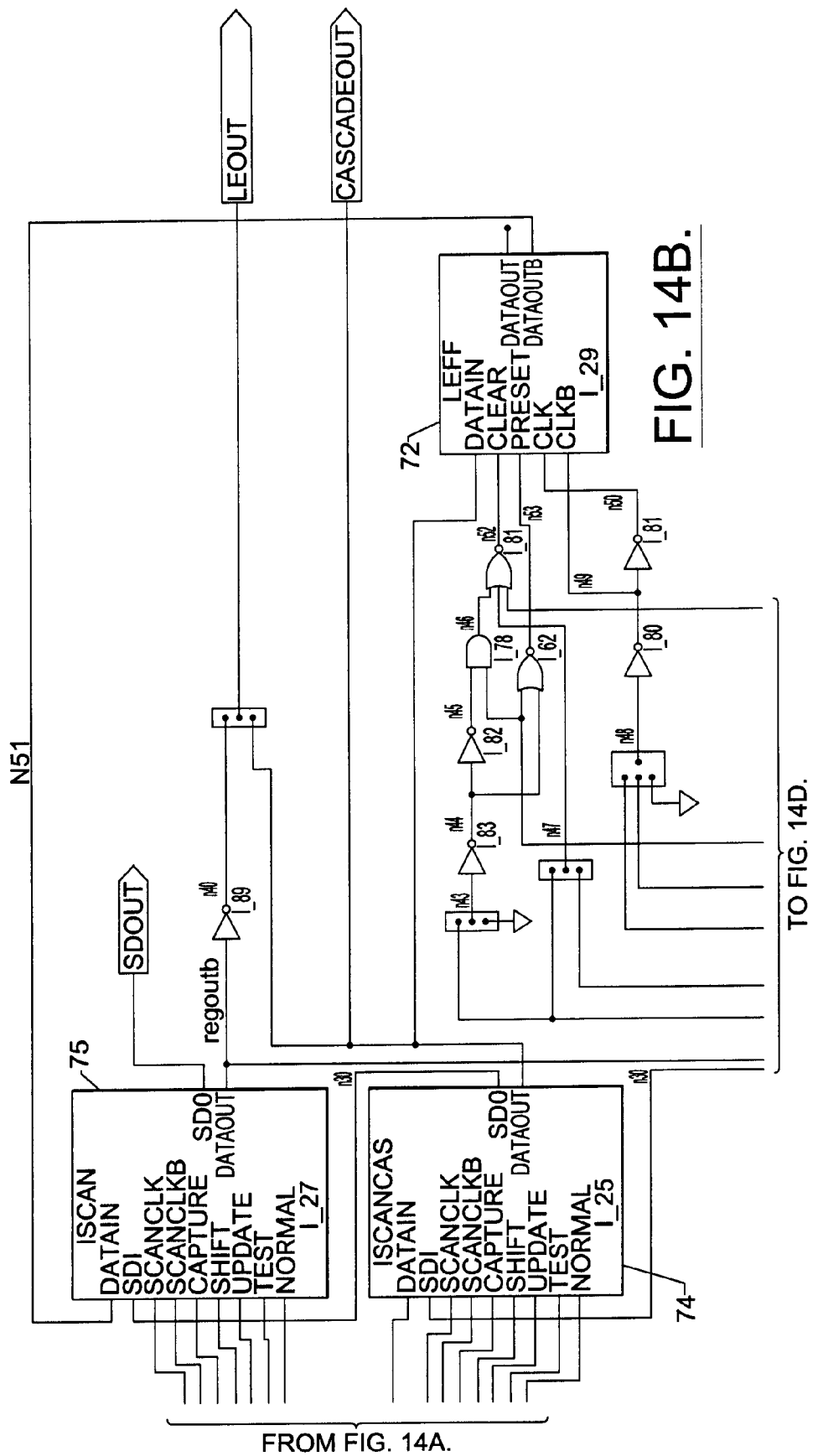
FIG. 14 is a schematic diagram representation of the portion of a base gate array device shown in FIG. 13.
Figure 14C:
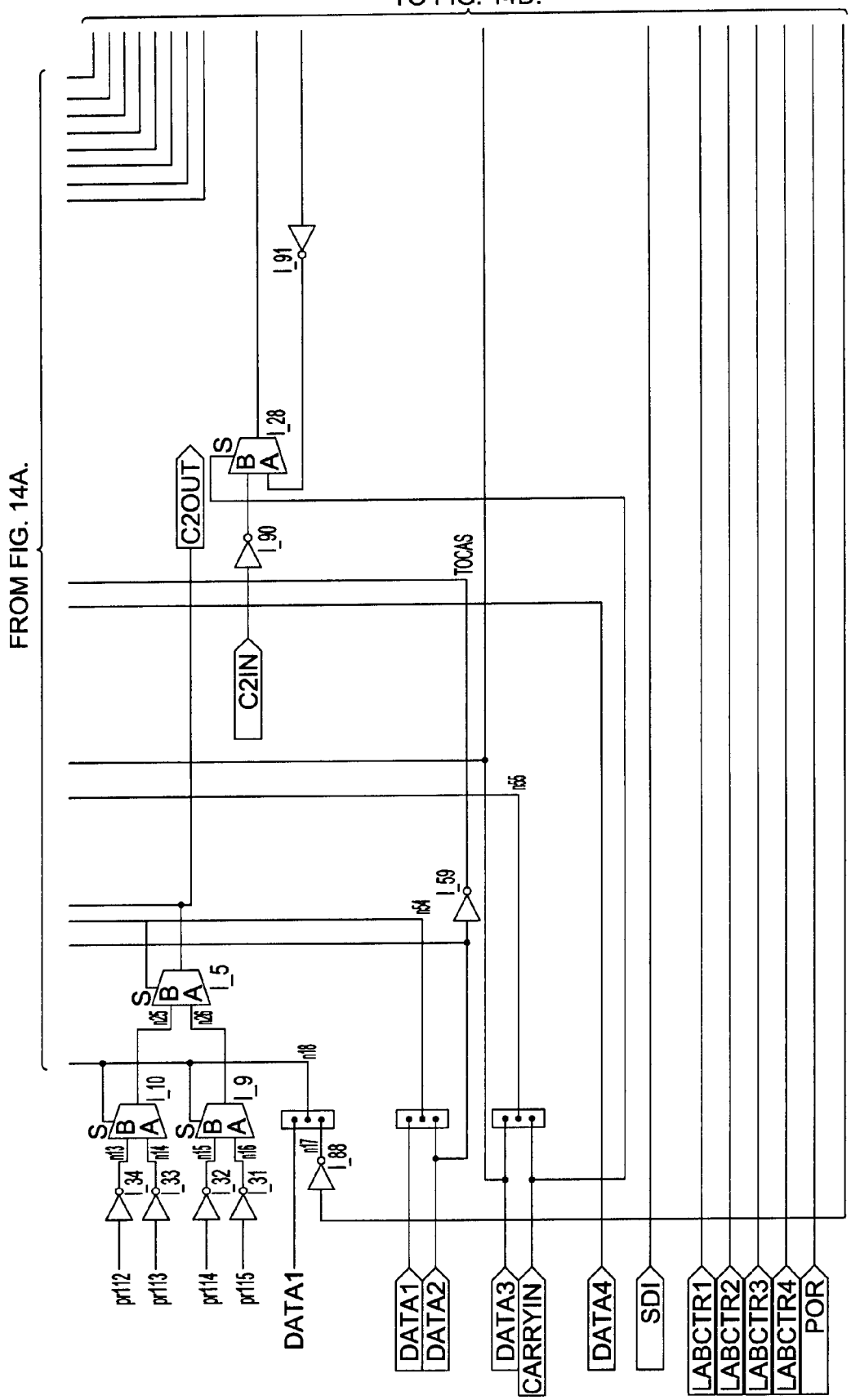
Figure 14D:
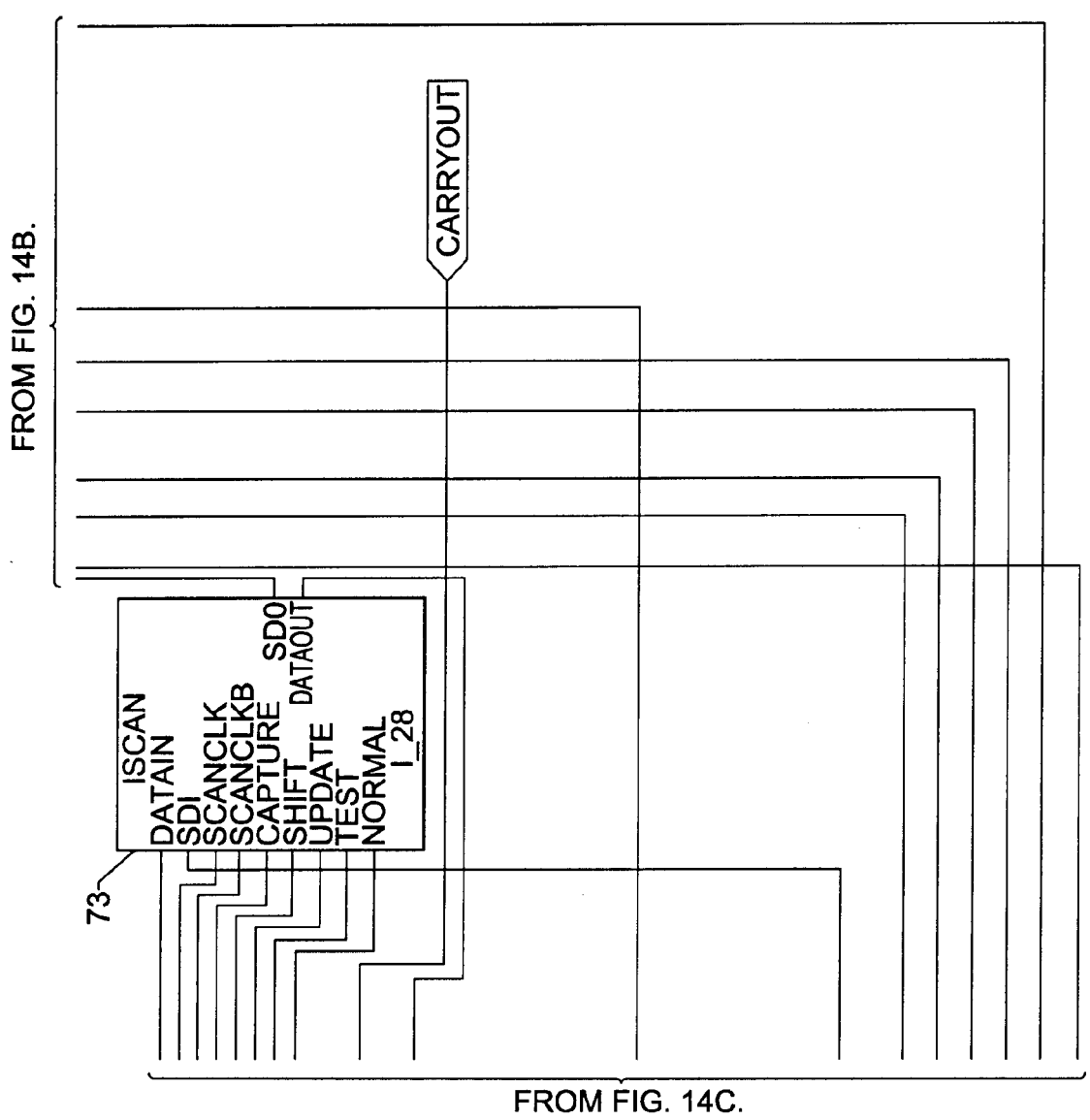

FIG. 14 shows a schematic diagram of the logic element section 70 of the base gate array shown in FIG. 13. This schematic diagram more completely shows the logic resources and possible connections of the base gate array logic element section 70, including register 72 and scan registers 73, 74, and 75. It will be apparent to one skilled in the art that additional internal scan registers can be placed as required in other areas of gate array device 599 such that scan test of the majority of the operational logic can be performed without use of all the device pins.

Figure 4:
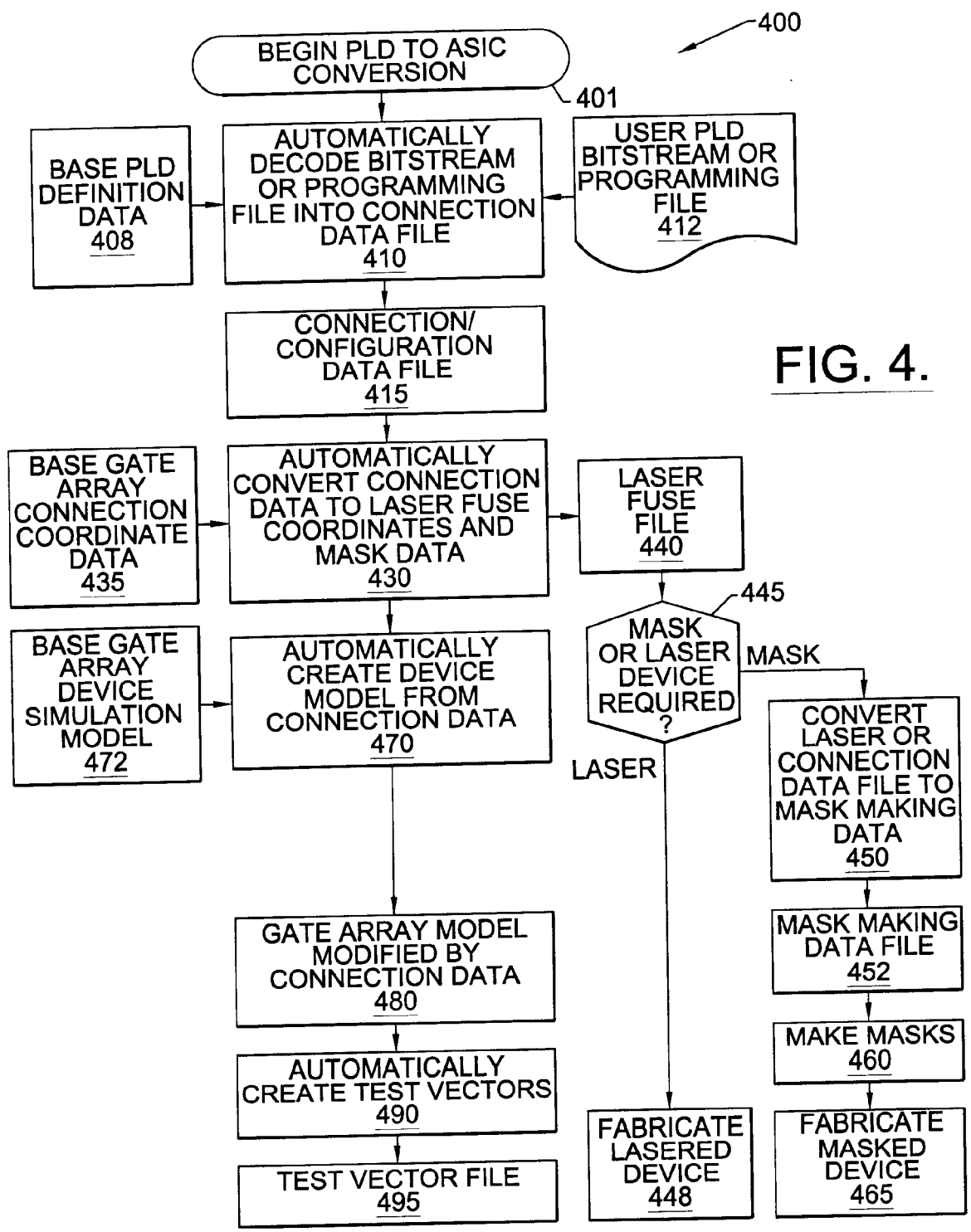
FIG. 4 is a flow diagram of preferred operations for converting a PLD implementation of an integrated circuit to a gate array having equivalent functionality.

Referring now to FIG. 4, preferred operations 400 will now be described for designing an application specific integrated circuit (ASIC), by directly converting bitstream data of a programmable logic device (PLD) having first logic and signal path resources into connection data (e.g., a netlist) which is compatible with an ASIC (e.g., gate array) having the first logic and signal path resources as well. This bitstream data, programming-ready for writing directly into the PLD, or into a Programmable Read-Only Memory (PROM), may be a file generated by MAXPLUS™ II software in Intel™ hex format, or other appropriate format for the PLD. As illustrated by Block 410, an operation is initially performed to automatically decode a PLD bitstream or programming file, Block 412, and generate a connection/configuration data file therefrom, Block 415. As described more fully hereinbelow, this decoding operation is performed using PLD definition data, Block 408. This definition data may include a data set that describes the function of a majority of the bits contained within the bitstream or a data set that describes the functionality of the PLD as defined by the bits, or both. This connection/configuration data may represent logic, logic states and interconnections specified in a bitstream provided by a user. The data will contain information relating to the configuration of logic resources into various logic segments, as well as relative placement of these logic segments, and the routing of signal paths. The combination of the circuit resource and routing resource information of the base gate array and the connection/configuration data can yield information about the placement of the logic resources and the routing of signals between those resources (including the starting and terminating points of at least one connection path on the target gate array integrated circuit).

Operations are then performed to convert the configuration/connection data to laser fuse coordinates and/or mask data, Block 430. Here, the connection/configuration data file, Block 415, and base gate array integrated circuit connection coordinate data, Block 435, are used to create a laser fuse file, Block 440.

A test vector file, Block 495, is also generated by automatically creating test vectors, Block 490, from the modified gate array models, Block 480. These test vectors may also be used for scan-based testing. As will be understood by those skilled in the art, scan-based test methods may utilize a plurality of storage elements which are connected together as a chain on an integrated circuit substrate. During testing, these elements can be loaded with input test data using a reduced number of I/O pins, as described by U.S. Pat. No. 5,519,713 to Baeg et al. entitled "Integrated Circuit Having Clock-Line Control and Method for Testing Same".

In addition, the laser fuse file, Block 440, can be used to fabricate a lasered device, Blocks 445 and 448. Alternatively, the laser fuse file Block 440, and/or the connection/configuration data, Block 415, can be converted to a mask making data file, Blocks 450, 452. Using conventional operations, the mask making data file can be used to make fabrication masks, Block 460, and fabricate the target gate array (having at least the same signal path resources and logic resources as the programmed PLD), Block 465.

According to another aspect of the present invention, the decoding operation may also generate hookup data as connection/configuration data which describes a plurality of patterned interconnect segments in the gate array which, when joined, create an electrically conductive path between starting and terminating points, and hookup coordinates which describe, relative to an origin, connection points between these patterned interconnect segments. These coordinates may also give the location of points of disconnect to form a single path out of a plurality of possible signal paths. For example, the base target gate array may have both the first and second nets connected and the connection/configuration data file may provide hookup data which designates which of the first or second nets is to be disconnected in the base gate array to provide the desired function The above-described operations for decoding a bitstream for a PLD 500 having first logic and signal path resources therein into a connection/configuration data file for a gate array integrated circuit having equivalent logic and signal path resources will now be more fully described with reference to FIG. 5C. In particular, FIG. 5C illustrates a exemplary portion of a programmable logic device (PLD) element 30 which can be converted directly to a gate array integrated circuit by decoding the bitstream which programs the PLD element 30 as a connection/configuration data file. This exemplary portion is a logic element of a FLEX 8000 architecture used in PLDs manufactured by Altera Corporation of San Jose, Calif. Here, the decoding process utilizes base PLD definition data to interpret a pattern of bits within a bitstream or programming file used to program the PLD 500 and determine the function of each bit or combination of bits. This bitstream may take the form of:

```
00001000000000100000011100000.............1000000010100
00001000000100001000000110............000000101100001
000000000100000000000000............1110000100000010
00000110000000001110000............111110000
       *    *    *    *    *
00001000000110100000011100000.............1000000110100
000010011001000010000001110............0001001011
00000100001100010000000000000............111001010
00001001100110000000001110000............111110001.
```

The geometry of the bits within the bitstream can be representative of the logic and signal path resources of the PLD or it can be independent of the PLD structure. For example, bit "n" of the bitstream as the control for multiplexer 10 via a select input 11. If the multiplexer 10 is programmed within the PLD to pass input line 12 to the output line 14, the LE-OUT signal will be provided directly by the output 20 of the cascade chain 15 in the target gate array. Alternatively, if the multiplexer 10 is programmed to pass input line 13 to the output line 14, the LE-OUT signal will be provided directly by the output of the register 16 in the target gate array. Thus, the function of bit "n" in the bitstream would be to determine whether LE-OUT is registered or not registered. Then, upon decoding of the bitstream, the connection/configuration data file would indicate whether a first net interconnecting the output 20 of the cascade chain 15 directly to LE-OUT is to be provided or whether a second net connecting the output Q of register 16 to LE-OUT is to be provided. A similar process is also repeated for each of the remaining bits in the bitstream, with the PLD device definition data (Block 408) associating a particular bit or bits in the bitstream with a function and the gate array device connection/configuration data (Block 415) associating the function with a plurality of nets. The high efficiency of this decoding process is preferably achieved by the base gate array having similar signal path and logic resources as the target PLD. In particular, the base gate array 599 should have at least the logic and signal path resources available in the target PLD 500.

FIG. 6 shows a pictorial representation 600 of a portion of data set 408 showing how an exemplary bitstream file 412 for such a PLD device such as device 500 disposed in 5 rows and 22 columns of LEs 30 grouped into logic blocks 520 of eight logic elements would commonly be organized. It is common for records other than the header and trailer to be a uniform length, however this is not a requirement. FIG. 6 illustrates such an exemplary bitstream file of 208 records in length with a uniform record length of 240 bits each. The bitstream file begins with a header record 610, followed by several records 620 containing configuration bits for the top I/Os 510. At the bottom of the file are additional bottom I/O configuration records 630 and a trailer record 640. The center section of the file contains multiple groups of records for configuring each of the five rows of logic block 520 as well as the interconnections to rows 502 and columns 503 and the left and right side I/Os 510 as well. The third row is described by records 85 to 124. Within this section records 117–124 can be seen to contain the LE Configuration bits, and more particularly, bits 21–30 of these records 650 can be seen to contain the LE Configuration bits for the LB in column 2 of row 3 and these blocks of LE Configuration bits are replicated in a typically geometric fashion for columns 1 to 22.

FIG. 7 shows a pictorial representation 700 of another section of data set 408, containing the definitions of a portion of the bits in the LE Config area for each LB. This area of the file 412 is shown to contain 8 records of 10 bits in width. It can be seen from table 700 that there is one record for each of the eight logic elements 30 in the logic block, which happen in this case to match the order of the logic elements, but this is not required. Table 700 show that bit fields 2 and 8 are unused and that the order of the other bits and their polarities are constant throughout the block, but this will depend upon the layout of PLD device 500 and need not be constant. Table 700 also shows logic states for only single bits, with each bit defining the logic states of two logical connections only. This is not a limiting aspect of the invention, and other numbers of bits or combinations of bits and other numbers of logical connections may be more advantageous in other cases. Entry 701 of table 700 corresponds to the setting of logic state 11 controlling MUX 10 , and shows that to make the LE-Out of the second LE in an LB be registered, the third bit of the second record of this block is set to 1 such that KREG is true and KUNREG is false. For bypass of register 16 by MUX 10, the bit is set to 0, such that KREG is false and KUNREG is true, where the values of KREG and KUNREG correspond to the possible logical connections of MUX 10 of logic element 30 of the PLD device 500 to be converted. It will be apparent to one skilled in the art that computing the position of this bit "n" within file 412 can be easily accomplished, and that by observing the status of this and other bits within the bitstream file 412, given a full description of the file with tables such as those described above, the intended functions of the logic elements, and the intended connections within the PLD can also be established. It will also be apparent to one skilled in the art that there are multiple ways to tabulate and store the PLD definition data 408, other than in the forms shown in these drawings.

FIGS. 8 and 9 show exemplary tables which are a portion of data set 435 for use in the calculation of hookup coordinates in step 430. Tables 800 and 850 which indicate the base coordinates of LBs for the calculation of such hookup coordinates show the respective Y coordinate bases of each of the rows of LBs in the gate array base array relative to an origin, and the X coordinate bases of each column of LBs within each row relative to an origin. Table 860 shows the offsets of individual connection or disconnection points relative to such LB base coordinates. Referring to the example above, the base coordinates of the LB located on the third row and second column would be (−1910,50). Referring to FIG. 9 we see that when the first operational functionality of PLD device 500 includes setting LE-Out to registered, this corresponds to KREG=true and KUNREG= false. In this example we have used "true" to correspond to connections made or kept and "false" to correspond to connections broken or not made. Therefore we would make the connection corresponding to KREG=true and break the connection corresponding to KUNREG=false. Therefore a connection to be made or retained would be computed equal to the base address of the LB (−1910,50) from tables 800 and 850, plus the offset for KREG of LE 2 (70,810) from table 860, resulting in coordinates of (−1840,860) and coordinates of a connection to be broken or not made would be computed likewise to be (−1910,50)+(180,775)=(−1730,825). These coordinates would then be entered into file 440 for use in making mask data 452 or lasering the device 448 using techniques well known in the art. Operations are then performed to automatically create gate array device models, Block 480, by modifying base gate array integrated circuit simulation models, Block 472, using the connection/ configuration data file, Block 415.

FIGS. 10A through 10F show an exemplary portion of a base gate array device simulation model 472 in Verilog for a section 70 of the base gate array to correspond to the logic element 30 of device 500. FIG. 10C describes three internal scan based test registers 830 labeled "iscan i_25", 831 labeled "iscan i_26", and 832 labeled "iscan i_27". FIG. 10D contains various logic and register 840, the equivalent to register 16 with the title "leff i_29". FIG. 10E contains the settings for the 16 lookup-table values for the base gate array LUT 71, and FIG. 10F contains the assignments for the LE configuration bits of the base gate array referred to in table 700.

Figure 1B:
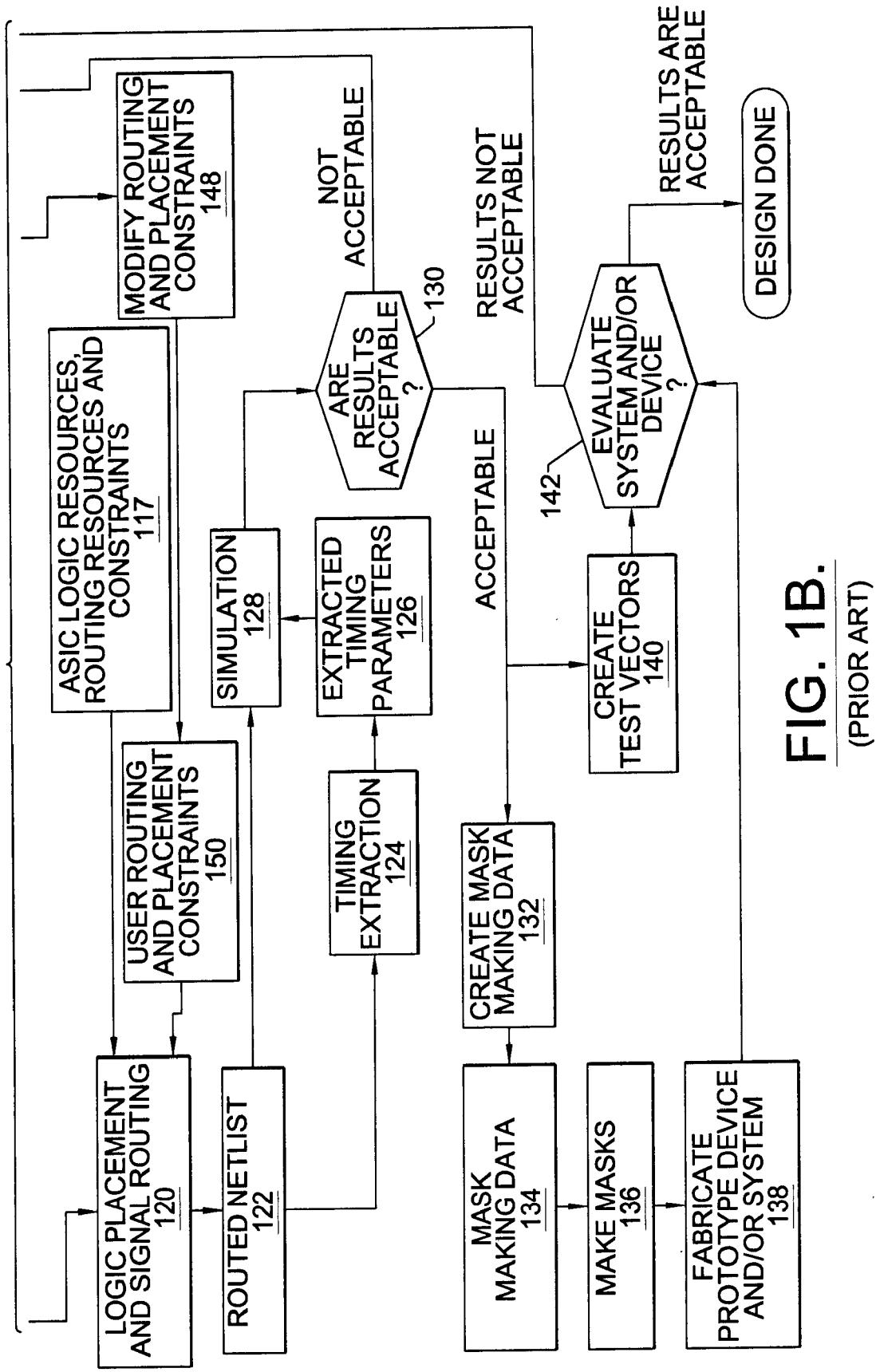
FIG. 1 is a flow diagram of operations which may be performed when designing a conventional application specific integrated circuit (ASIC).
Figures 2, 2A, 2B:
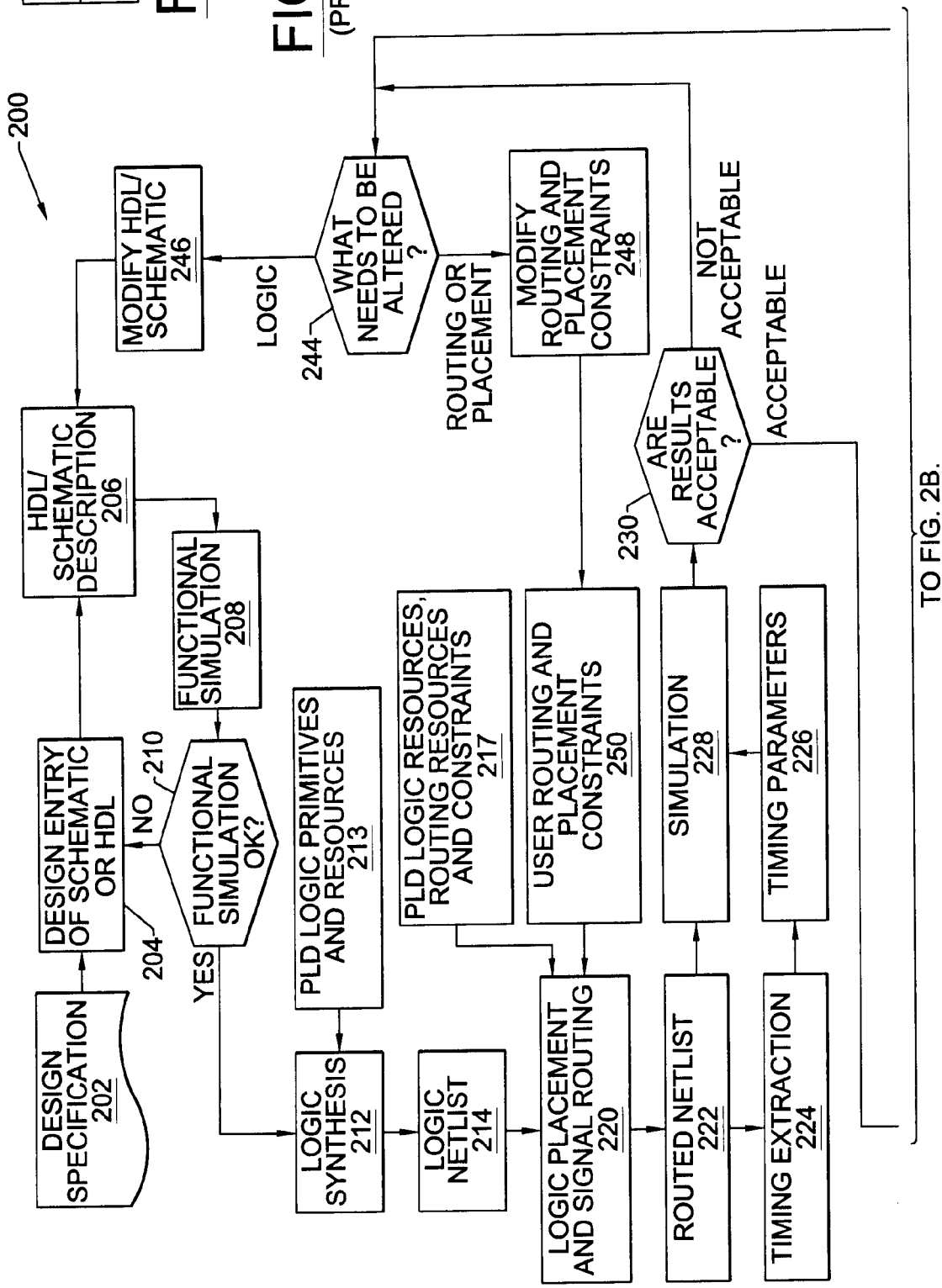
FIG. 2 is a flow diagram of operations which may be performed when designing a conventional programmable logic device (PLD).
Figure 2B:
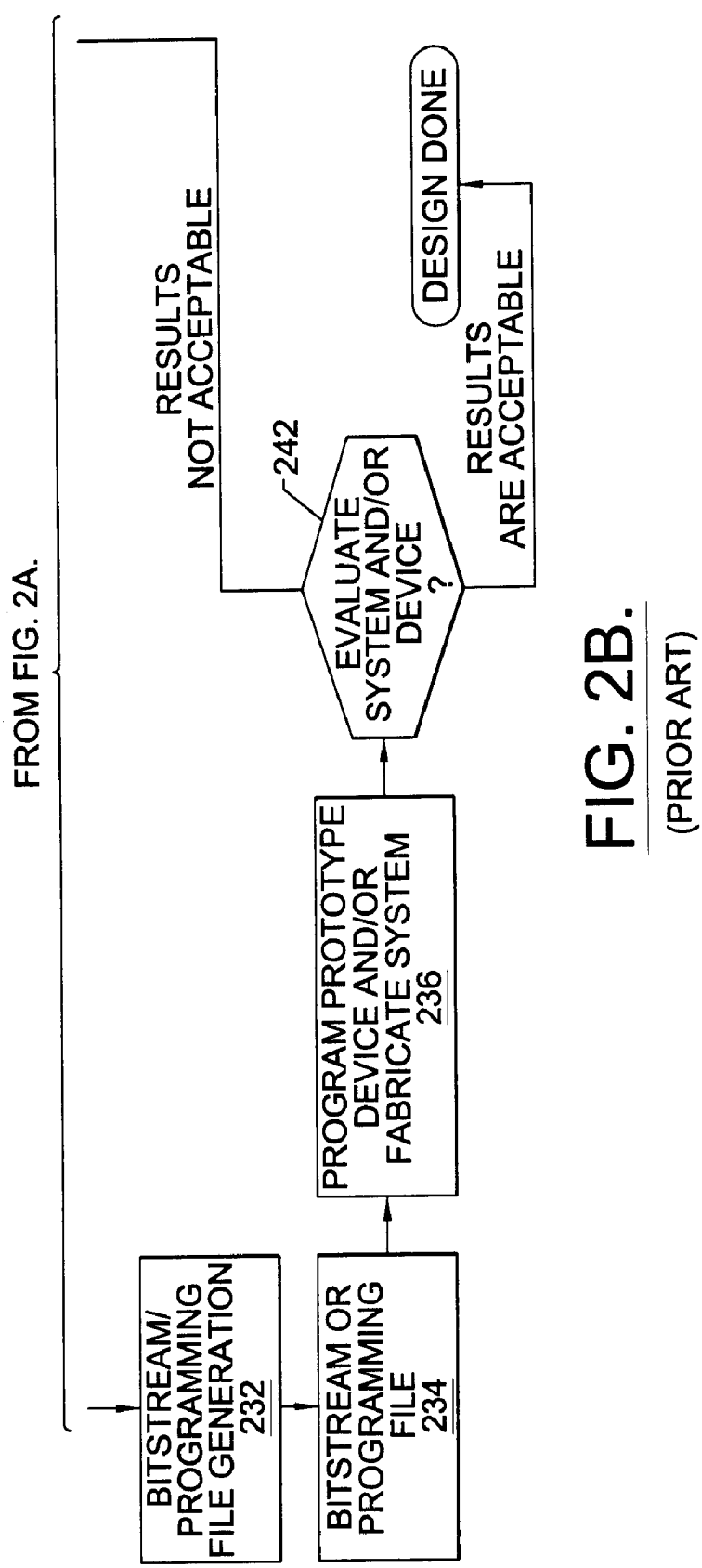
Figure 3A:
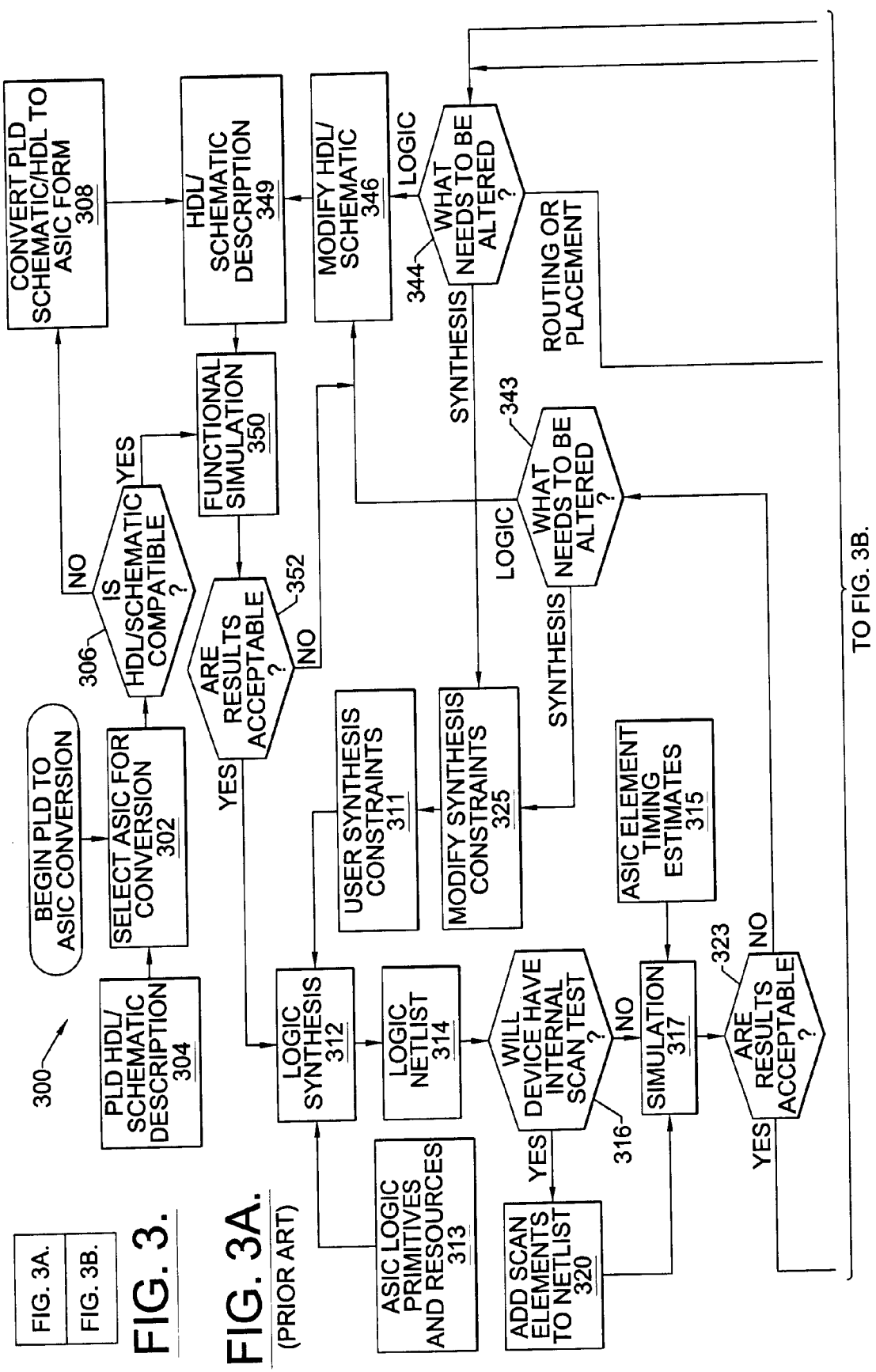
FIG. 3 is a flow diagram of conventional operations which may be performed when converting a PLD implementation of an integrated circuit to an application specific integrated circuit.
Figure 3B:
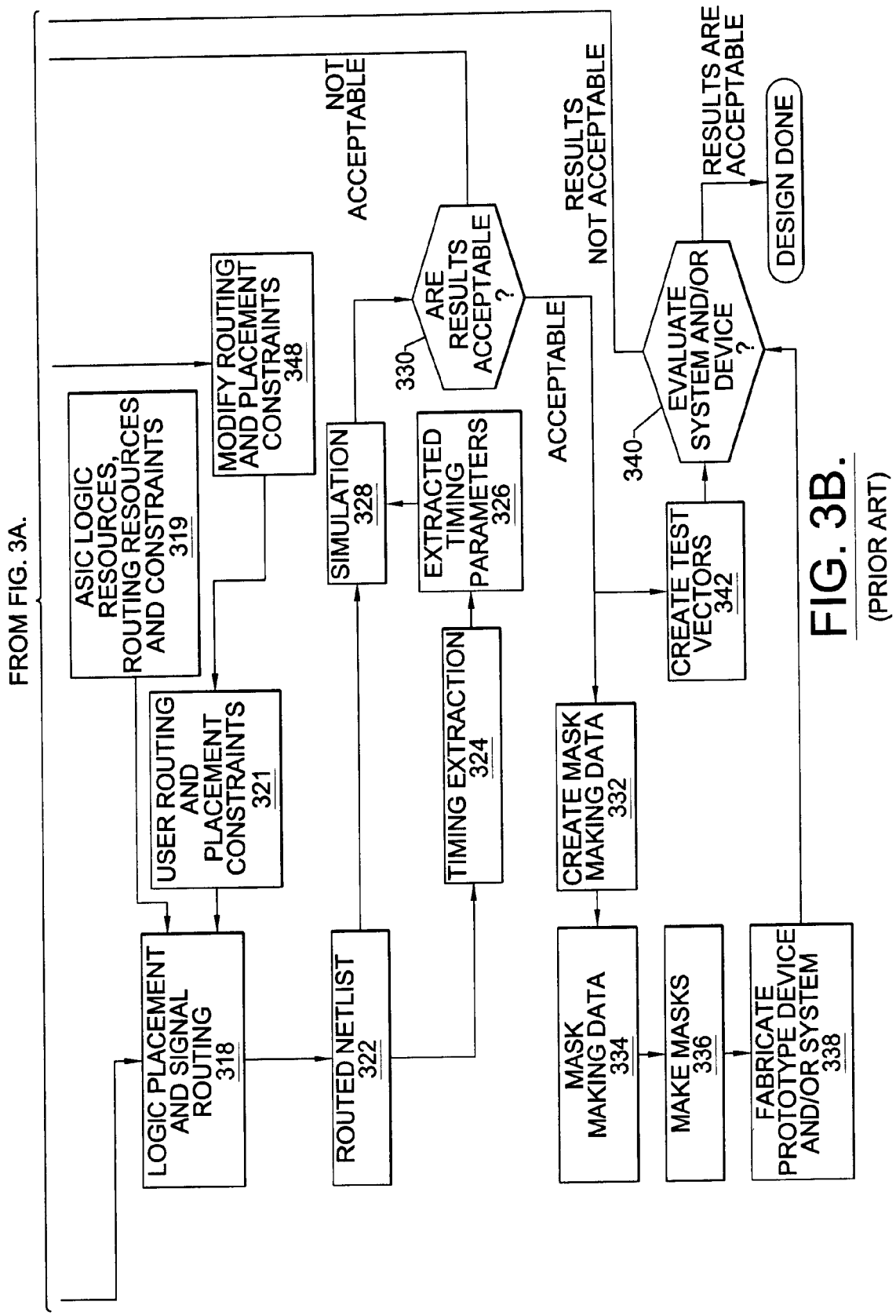

FIG. 11 shows a section 833 of connection/configuration data file 415 which shows several logic states and configurations specified by bitstream file 412 as decoded by process 410. More particularly this section of file 415 refers to the LE configuration bits for LE 2 of the LB on row 3 and column 2, designated by the line prefix "LB,3,2,LE2,". Each line ends with the desired state of a connection or logic state, such as <KREG>=T and <KUNREG>=F, designating that the lines in the base gate array model 472 on FIG. 1 OF ending in <KREG> are to be included in the modified model 480, and the lines ending in <KUNREG> are not to included in the modified model 480, after processing by step 470 is completed. FIG. 12 shows the modified lines of code of the modified model 480 corresponding to the settings defined by file 415 as shown on FIG. 11. It will be apparent to one skilled in the art that there are other ways to create modified gate array simulation model 480, and that model 480 can be subsequently used in the creation of test vector file 495.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of designing an integrated circuit device, comprising the step of:
   generating a netlist for a gate array integrated circuit having base logic and signal path resources, from bitstream data that characterizes operation of a programmable logic device having unprogrammed logic and signal path resources that are equivalent to the base logic and signal path resources.

2. The method of claim 1, wherein the bitstream data characterizes a programmable logic device having a first operational functionality; and wherein said generating step is followed by the step of using the netlist to configure the base logic and signal path resources within the gate array integrated circuit to provide the first operational functionality.

3. The method of claim 2, wherein said generating step comprises determining end points of at least one net in the netlist directly from at least one bit of the bitstream data.

4. The method of claim 2, wherein said generating step comprises generating a netlist for a gate array integrated circuit from bitstream data and programmable logic device definition data.

5. The method of claim 4, wherein said generating step comprises determining end points of at least one net in the netlist directly from at least one bit of the bitstream data and the programmable logic device definition data.

6. The method of claim 2, further comprising the step of generating test vectors from the netlist.

7. The method of claim 6, further comprising the step of performing a scan-based test of the gate array integrated circuit.

8. The method of claim 1, wherein said generating step comprises generating a netlist from bitstream data, programmable logic device definition data and gate array device definition data.

9. The method of claim 1, wherein said generating step comprises generating a netlist for a gate array integrated circuit from bitstream data that characterizes a programmable logic device, without performing a gate array design operation selected from the group consisting of logic synthesis, logic placement and logic routing.

10. An integrated circuit design system, comprising:
    a programmable logic device having pre-programmed logic and signal path resources;
    a gate array device having pre-wired logic and signal path resources that are congruent to the pre-programmed logic and signal path resources of said programmable logic device; and
    means for decoding a bitstream that characterizes operation of said programmable logic device having a first operational functionality when programmed, into a netlist that designates electrical connections in said gate array device when wired to have the first operational functionality, while avoiding an intervening gate array design operation selected from the group consisting of logic synthesis, logic placement and logic routing.

11. A method of designing an integrated circuit device, comprising the step of:
    generating hookup data that characterizes a plurality of nets for a gate array integrated circuit having a first operational functionality, from bitstream data that characterizes operation of a programmable logic device having the first operational functionality and without synthesizing logic for the gate array integrated circuit.

12. The method of claim 11, wherein said generating step comprises generating hookup data which characterizes a plurality of nets for a gate array integrated circuit having a first operational functionality, directly from bitstream data which characterizes a programmable logic device having the first operational functionality.

13. The method of claim 12, wherein said generating step comprises generating hookup data for a gate array integrated circuit having a first operational functionality and logic resource placement that is the same as the programmable logic device.

14. The method of claim 12, wherein said generating step comprises generating hookup data for a gate array integrated circuit having a first operational functionality and signal path resources which are the same as the programmable logic device.

15. The method of claim 12, wherein hookup coordinates are generated from the hookup data, said hookup coordinates defining connection points of at least two nets.

16. The method of claim 15, further comprising the step of forming a first set of electrical connections between the at least two nets on the gate array integrated circuit; and wherein the locations of the first set of electrical connections are defined by the hookup coordinates.

17. The method of claim 16, wherein said step of forming a first set of electrical connections comprises the use of a targeting energy beam.

18. The method of claim 16, wherein said step of forming a first set of electrical connections comprises the use of a photomask which contains a pattern thereon having a location designated by the hookup coordinates.

19. A method of designing an integrated circuit device, comprising the step of:
    decoding a bit stream, which characterizes operation of a programmable logic device (PLD) having unprogrammed logic and signal path resources therein, into a netlist that characterizes a gate array integrated circuit having base logic and signal path resources therein that are sufficiently congruent to the unprogrammed logic and signal path resources of the PLD that said decoding step is performed independent of at least one gate array design operation selected from the group consisting of logic synthesis, logic placement and logic routing.

20. A method of designing an integrated circuit device, comprising the step of:
    decoding a bit stream, which characterizes operation of a programmable logic device (PLD) having unprogrammed logic and signal path resources therein, into a netlist that characterizes a gate array integrated circuit having base logic and signal path resources therein that are sufficiently congruent to the unprogrammed logic and signal path resources of the PLD that at least a first plurality of segments of logic in the PLD are in the same relative locations as a corresponding second plurality of segments of logic in the gate array integrated circuit, said decoding step being performed independent of a design operation to place or route the second plurality of segments of logic in the gate array integrated circuit.

* * * * *